United States Patent
Mizoguchi et al.

(10) Patent No.: US 9,510,434 B2
(45) Date of Patent: Nov. 29, 2016

(54) EXTREME ULTRAVIOLET LIGHT GENERATING APPARATUS, METHOD OF GENERATING EXTREME ULTRAVIOLET LIGHT, CONCENTRATED PULSED LASER LIGHT BEAM MEASURING APPARATUS, AND METHOD OF MEASURING CONCENTRATED PULSED LASER LIGHT BEAM

(71) Applicant: GIGAPHOTON INC., Tochigi (JP)

(72) Inventors: Hakaru Mizoguchi, Tochigi (JP); Yasufumi Kawasuji, Tochigi (JP); Osamu Wakabayashi, Tochigi (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 14/824,270

(22) Filed: Aug. 12, 2015

(65) Prior Publication Data

US 2015/0351211 A1   Dec. 3, 2015

Related U.S. Application Data

(63) Continuation of application No. PCT/JP2013/083048, filed on Dec. 10, 2013.

(30) Foreign Application Priority Data

Mar. 21, 2013   (JP) .................................. 2013-057994

(51) Int. Cl.
   *H05G 2/00*   (2006.01)
   *G21K 1/06*   (2006.01)
   *G03F 7/20*   (2006.01)

(52) U.S. Cl.
   CPC .......... *H05G 2/008* (2013.01); *G03F 7/70033* (2013.01); *G21K 1/067* (2013.01); *H05G 2/003* (2013.01); *H05G 2/005* (2013.01)

(58) Field of Classification Search
   CPC .. G21K 1/067; G03F 7/70033; H05G 2/008; H05G 2/03; H05G 2/005
   See application file for complete search history.

(56) References Cited

U.S. PATENT DOCUMENTS

| | | |
|---|---|---|
| 5,017,012 A | 5/1991 | Merritt et al. |
| 2004/0195529 A1 | 10/2004 | Hergenhan et al. |

(Continued)

FOREIGN PATENT DOCUMENTS

| | | |
|---|---|---|
| JP | 2004-303725 A | 10/2004 |
| JP | 2007-109451 A | 4/2007 |

(Continued)

OTHER PUBLICATIONS

International Search Report for PCT/JP2013/083048 dated Feb. 25, 2014.

*Primary Examiner* — Yara B Green
(74) *Attorney, Agent, or Firm* — Studebaker & Brackett PC

(57) ABSTRACT

Provided is an extreme ultraviolet light generating apparatus that may include: a chamber containing one or more kinds of gases; a light concentration optical system provided in an optical path of pulsed laser light outputted from a laser unit, and configured to concentrate the pulsed laser light into a concentrated beam; and an image pickup section provided at a position out of the optical path of the pulsed laser light, and configured to pick up a plasma emission image that is an image of plasma emission in the chamber. The plasma emission is caused by application of the concentrated beam to the one or more kinds of gases in the chamber.

12 Claims, 19 Drawing Sheets

(56) References Cited

U.S. PATENT DOCUMENTS

| | | | |
|---|---|---|---|
| 2009/0032740 A1* | 2/2009 | Smith | B82Y 10/00 250/503.1 |
| 2010/0090133 A1 | 4/2010 | Endo et al. | |
| 2011/0284774 A1* | 11/2011 | Ishihara | H05G 2/003 250/504 R |
| 2012/0223256 A1 | 9/2012 | Bykanov et al. | |
| 2012/0228525 A1 | 9/2012 | Moriya et al. | |
| 2013/0037693 A1 | 2/2013 | Moriya et al. | |
| 2014/0264091 A1* | 9/2014 | Fleurov | H05G 2/008 250/504 R |

FOREIGN PATENT DOCUMENTS

| | | |
|---|---|---|
| JP | 2010-103499 A | 5/2010 |
| JP | 2012-178534 A | 9/2012 |
| JP | 2012-199512 A | 10/2012 |
| WO | WO 2012-085638 * | 6/2012 |

* cited by examiner

EXTREME ULTRAVIOLET LIGHT GENERATING APPARATUS, METHOD OF GENERATING EXTREME ULTRAVIOLET LIGHT, CONCENTRATED PULSED LASER LIGHT BEAM MEASURING APPARATUS, AND METHOD OF MEASURING CONCENTRATED PULSED LASER LIGHT BEAM

CROSS REFERENCE TO RELATED APPLICATIONS

This is a continuation of International Application No. PCT/JP2013/083048, filed Dec. 10, 2013, which claims the benefit of Japanese Priority Patent Application JP2013-057994, filed Mar. 21, 2013, the entire contents of both of which are incorporated herein by reference.

BACKGROUND

The disclosure relates to an apparatus that generates extreme ultraviolet (EUV) light, and a method of generating the extreme ultraviolet light. The disclosure also relates to an apparatus that measures a concentrated beam of pulsed laser light, and a method of measuring the concentrated beam of the pulsed laser light.

In recent years, miniaturization of a transcription pattern of an optical lithography in a semiconductor process is drastically progressing with the development in fining of the semiconductor process. In the next generation, microfabrication on the order of 70 nm to 45 nm, and further microfabrication on the order of 32 nm or less are bound to be required. To meet such requirement for the microfabrication on the order of, for example, 32 nm or less, development is anticipated of an exposure apparatus that includes a combination of a reduced projection reflective optics and an extreme ultraviolet light generating apparatus that generates extreme ultraviolet (EUV) light with a wavelength of about 13 nm. For example, reference is made to Japanese Unexamined Patent Application Publication Nos. 2012-178534 and 2012-199512, U.S. Patent Application Publication No. 2012/0223256, and U.S. Pat. No. 5,017,012.

Three types of apparatuses have been proposed for the extreme ultraviolet light generating apparatus, which are a laser produced plasma (LPP) apparatus that uses plasma generated by application of laser light to a target substance, a discharge produced plasma (DPP) apparatus that uses plasma generated by electric discharge, and a synchrotron radiation (SR) apparatus that uses orbital radiation light.

SUMMARY

An extreme ultraviolet light generating apparatus according to an embodiment of the disclosure may include: a chamber containing one or more kinds of gases; a light concentration optical system provided in an optical path of pulsed laser light outputted from a laser unit, and configured to concentrate the pulsed laser light into a concentrated beam; and an image pickup section provided at a position out of the optical path of the pulsed laser light, and configured to pick up a plasma emission image that is an image of plasma emission in the chamber. The plasma emission is caused by application of the concentrated beam to the one or more kinds of gases in the chamber.

A concentrated pulsed laser light beam measuring apparatus according to an embodiment of the disclosure may include: an image pickup section provided at a position out of an optical path of pulsed laser light, and configured to pick up a plasma emission image that is an image of plasma emission, in which the pulsed laser light is adapted to generate extreme ultraviolet light, and the plasma emission is caused by concentration of the pulsed laser light into a concentrated beam and application of the concentrated beam to one or more kinds of gases; and a measuring section configured to determine, based on the plasma emission image acquired from the image pickup section, a concentration position and a concentration width of the concentrated beam.

A method of generating extreme ultraviolet light according to an embodiment of the disclosure may include: supplying one or more kinds of gases into a chamber; causing a laser unit to output pulsed laser light; concentrating the pulsed laser light into a concentrated beam; applying the concentrated beam to the one or more kinds of gases in the chamber to generate a plasma emission image that is an image of plasma emission in the chamber; and picking up the plasma emission image by an image pickup section provided at a position out of an optical path of the pulsed laser light.

A method of measuring a concentrated pulsed laser light beam according to an embodiment of the disclosure may include: picking up an plasma emission image by an image pickup section provided at a position out of an optical path of pulsed laser light, in which the pulsed laser light is adapted to generate extreme ultraviolet light, the plasma emission image is an image of plasma emission, and the plasma emission is caused by concentrating the pulsed laser light into a concentrated beam and applying the concentrated beam to one or more kinds of gases; and determining, based on the plasma emission image acquired from the image pickup section, a concentration position and a concentration width of the concentrated beam.

BRIEF DESCRIPTION OF THE DRAWINGS

Some example embodiments of the disclosure are described below as mere examples with reference to the accompanying drawings.

DETAILED DESCRIPTION

Figure 1:
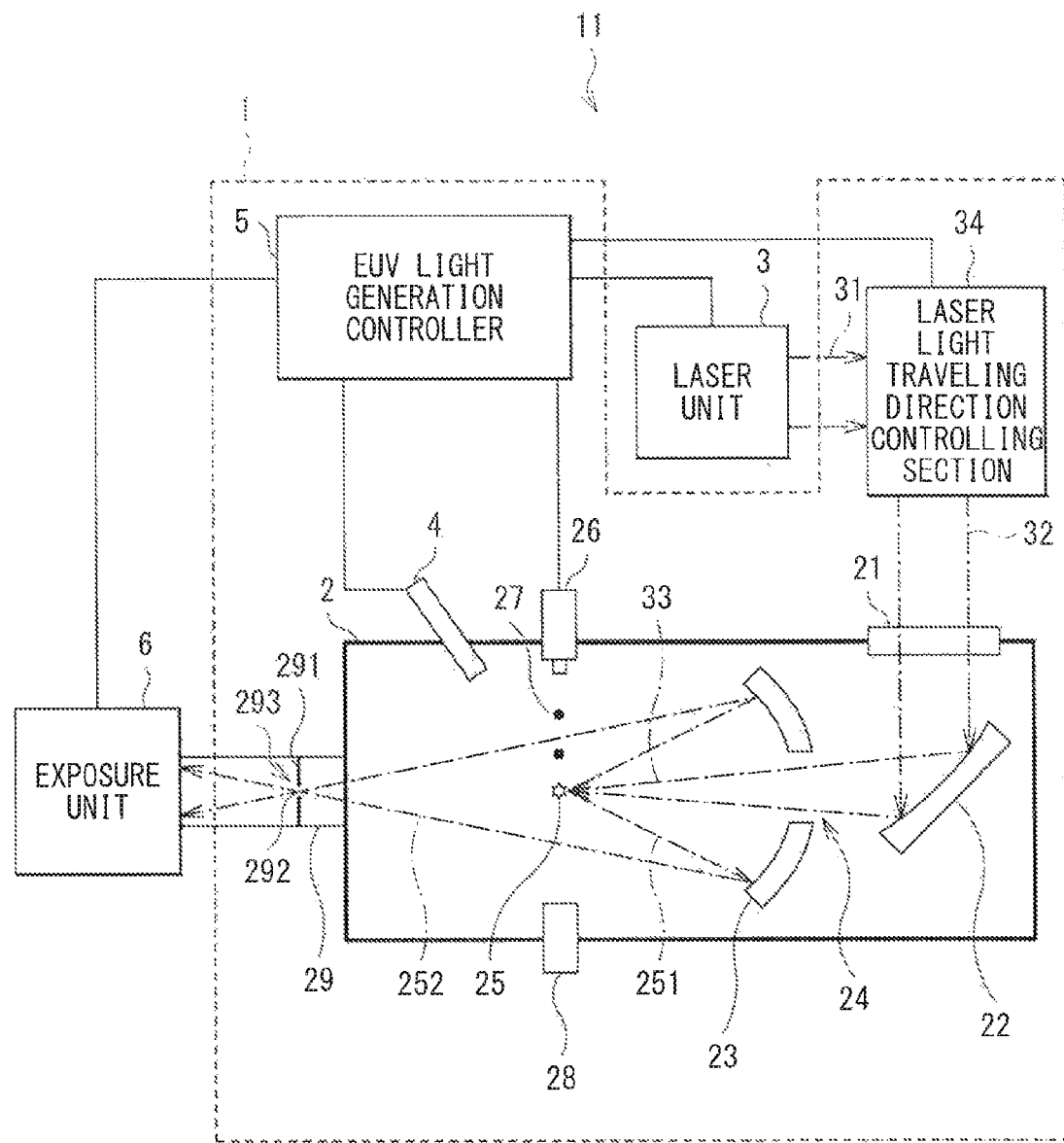
FIG. 1 schematically illustrates an example of a configuration of an exemplary laser produced plasma (LPP) extreme ultraviolet (EUV) light generating system according to an example embodiment of the disclosure.

[Contents]
[1. Outline]
[2. General Description of EUV Light Generating System]
  2.1 Configuration
  2.2 Operation
[3. Concentrated Pulsed Laser Light Beam Measuring Apparatus] (First Embodiment)
  3.1 Configuration
  3.2 Operation
    3.2.1 Overall Operation
    3.2.2 Main Flow of Measurement Controller
    3.2.3 Process of Capturing Image Data
    3.2.4 Calculation of Beam Waist Position Pw and Beam Waist Full Width Dw
  3.3 Action
  3.4 First Modification Example of First Embodiment (Modification Example on Generation of Shutter Trigger)
    3.4.1 Configuration
    3.4.2 Operation
    3.4.3 Action
  3.5 Second Modification Example of First Embodiment (Example Embodiment in which two cameras are provided)
    3.5.1 Configuration
    3.5.2 Operation
    3.5.3 Action
  3.6 Other Modification Examples
[4. EUV Light Generating Apparatus including Concentrated Pulsed Laser Light Beam Measuring Apparatus] (Second Embodiment)
  4.1 Configuration
  4.2 Operation
    4.2.1 Operation upon Generation of EUV Light
    4.2.2 Operation upon Measurement of Concentrated Beam
  4.3 Action
[5. Et Cetera]
  5.1 Relationship between Pressure of Inert Gas and Generation of Plasma
  5.2 Hardware Environment of Controller In the following, some example embodiments of the disclosure are described in detail with reference to the drawings. Example embodiments described below each illustrates one example of the disclosure and are not intended to limit the contents of the disclosure. Also, all of the configurations and operations described in each example embodiment are not necessarily essential for the configurations and operations of the disclosure. Note that the like elements are denoted with the same reference numerals, and any redundant description thereof is omitted.

1. Outline

One example embodiment of the disclosure may relate to an apparatus that measures an image of plasma emission generated upon concentration of pulsed laser light in inert gas.

2. General Description of EUV Light Generating System 2.1 Configuration

FIG. 1 schematically illustrates an example of a configuration of an exemplary laser produced plasma (LPP) extreme ultra violet (EUV) light generating system according to one example embodiment of the disclosure. An EUV light generating apparatus 1 may be used together with one or more laser units 3 (hereinafter collectively referred to as a "laser unit"). In the example embodiment of the present application, a system including the EUV light generating apparatus 1 and the laser unit 3 is referred to as an EUV light generating system 11. Referring to FIG. 1, and as described in detail below, the EUV light generating apparatus 1 may include a chamber 2 and a target feeding unit which may be, for example but not limited to, a target feeder 26. The chamber 2 may be sealable. The target feeder 26 may be so attached as to penetrate a wall of the chamber 2, for example. A material of a target substance to be fed from the target feeder 26 may be tin, terbium, gadolinium, lithium, xenon, or any combination of two or more thereof without limitation.

The wall of the chamber 2 may be provided with one or more through holes. The through hole may be provided with a window 21 through which pulsed laser light 32 outputted from the laser unit 3 may be transmitted. An EUV light concentrating mirror 23 including a spheroidal reflection surface may be provided inside the chamber 2, for example. The EUV light concentrating mirror 23 may include a first focal point and a second focal point. A surface of the EUV light concentrating mirror 23 may be provided with a multilayer reflection film in which, for example, molybdenum and silicon are alternately stacked. For example, the EUV light concentrating mirror 23 may be preferably disposed in such a manner that the first focal point is located in a plasma generation region 25 or in the vicinity of the plasma generation region 25, and that the second focal point is located at an intermediate focus point (IF) 292. The intermediate focus point 292 may be a desired light concentration position defined by specifications of an exposure unit. The EUV light concentrating mirror 23 may be provided with a through hole 24 provided at a center part of the EUV light concentrating mirror 23 and through which the pulsed laser light 33 may pass.

The EUV light generating apparatus 1 may include an EUV light generation controller 5. The EUV light generation controller 5 may include a target sensor 4, etc. The target sensor 4 may detect one or more of presence, trajectory, position, and speed of a target 27. The target sensor 4 may include an image-pickup function.

The EUV light generating apparatus 1 may include a connection section 29 that allows the inside of the chamber 2 to be in communication with the inside of the exposure unit 6. A wall 291 formed with an aperture 293 may be provided inside the connection section 29. The wall 291 may be disposed so that the aperture 293 is located at the second focal point of the EUV light concentrating mirror 23.

Further, the EUV light generating apparatus 1 may include a laser light traveling direction controlling section 34, a laser light concentrating mirror 22, a target collector 28, etc. The target collector 28 may collect the target 27. The laser light traveling direction controlling section 34 may control a traveling direction of the laser light, and to this end, may include an optical device that defines a traveling direction of the laser light, and an actuator that adjusts position, attitude, etc., of the optical device.

2.2 Operation

Referring to FIG. 1, the pulsed laser light 31 outputted from the laser unit 3 may travel through the laser light traveling direction control section 34. The pulsed laser light 31 having travelled through the laser light traveling direction control section 34 may then be transmitted, as pulsed laser light 32, through the window 21. The pulsed laser light 32 having been transmitted through the window 21 may then enter the chamber 2. The pulsed laser light 32 may travel inside the chamber 2 along one or more laser light paths, and then may be reflected by the laser light concentrating mirror 22. The pulsed laser light 32 reflected by the laser light concentrating mirror 22 may be applied, as the pulsed laser light 33, to one or more targets 27.

The target feeder 26 may be adapted to output the target 27 to the plasma generation region 25 inside the chamber 2. The target 27 may be irradiated with one or more pulses included in the pulsed laser light 33. The target 27 irradiated with the pulsed laser light may turn into plasma, and EUV light 251 may be radiated together with radiation light from the plasma. The EUV light 251 may be reflected and concentrated by the EUV light concentrating mirror 23. EUV light 252 reflected by the EUV light concentrating mirror 23 may travel through the intermediate focus point 292. The EUV light 252 having travelled through the intermediate focus point 292 may be outputted to the exposure unit 6. Note that a plurality of pulses included in the pulsed laser light 33 may be applied to one target 27.

The EUV light generation controller 5 may be adapted to manage a control of the EUV light generating system 11 as a whole. The EUV light generation controller 5 may be adapted to process, for example, data on an image of the target 27 picked up by the target sensor 4. For example, the EUV light generation controller 5 may be adapted to control one or both of output timing of the target 27 and an output direction of the target 27.

For example, the EUV light generation controller 5 may be adapted to control one or more of oscillation timing of the laser unit 3, the traveling direction of the pulsed laser light 32, and a concentration position of the pulsed laser light 33. Note that the various controls described above are illustrative, and any other control may be added on an as-needed basis.

3. Concentrated Pulsed Laser Light Beam Measuring Apparatus

First Embodiment

3.1 Configuration

Figure 2:
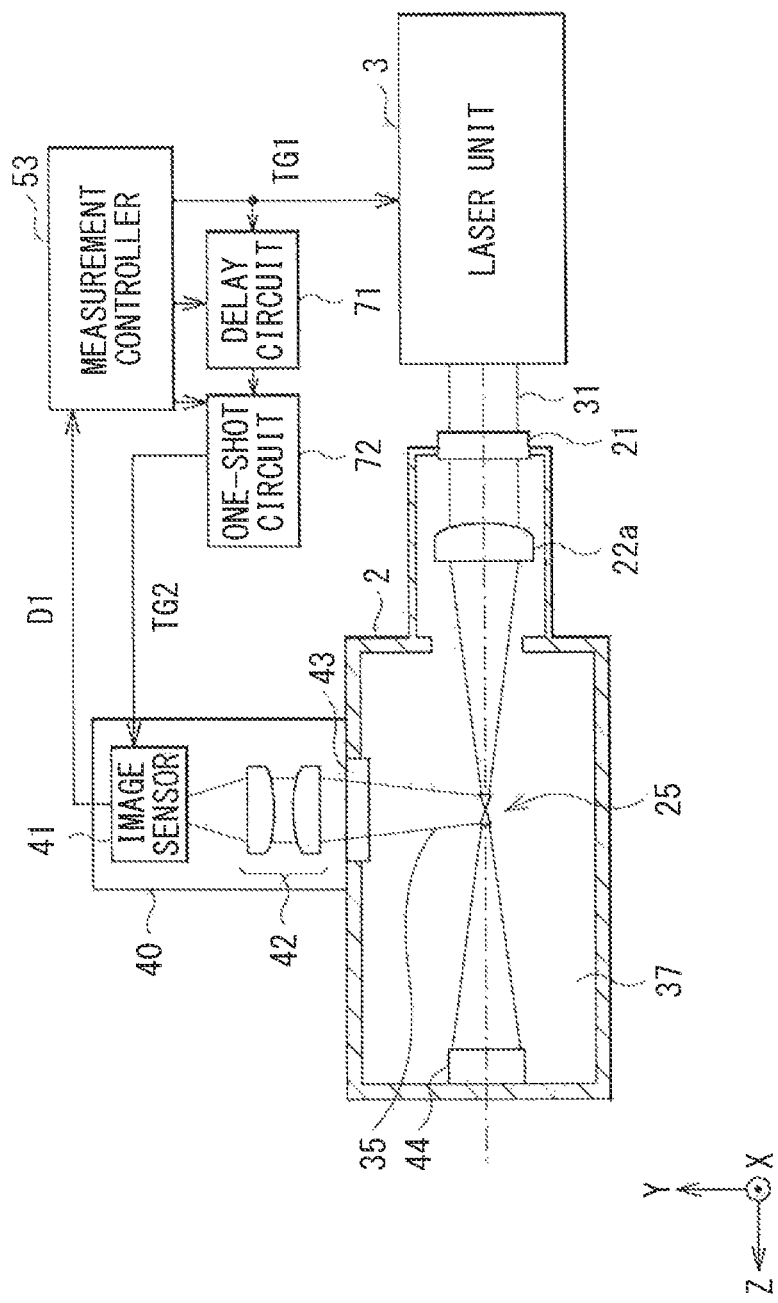
FIG. 2 schematically illustrates an example of a configuration of a concentrated pulsed laser light beam measuring apparatus according to a first embodiment of the disclosure.
Figure 3:
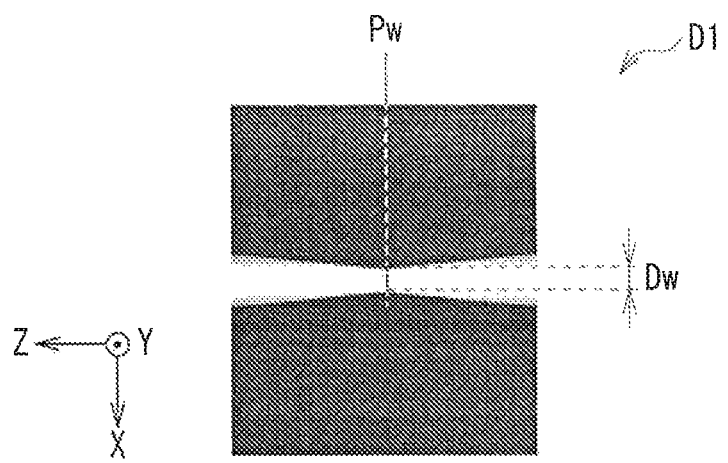
FIG. 3 schematically illustrates an example of image data obtained upon measuring a concentrated beam.

FIG. 2 illustrates an example of a configuration of a concentrated pulsed laser light beam measuring apparatus according to a first embodiment. FIG. 3 schematically illustrates an example of data on a plasma emission image as image data obtained upon measuring a concentrated beam.

The concentrated pulsed laser light beam measuring apparatus according to the first embodiment may be used together with the chamber 2 and the laser unit 3. The concentrated pulsed laser light beam measuring apparatus may include a camera 40, a measurement controller 53, a delay circuit 71, and a one-shot circuit 72.

The laser unit 3 may include a laser oscillator and a plurality of amplifiers. The laser oscillator may output the pulsed laser light 31. The amplifiers each may amplify the pulsed laser light 31. The laser oscillator and the amplifiers each may contain a $CO_2$ laser gas. The pulsed laser light 31 to be outputted from the laser unit 3 may involve a pulse energy in a range from 50 mJ to 400 mJ and a pulse width in a range from 10 ns to 25 ns. The laser oscillator may receive an oscillation trigger TG1.

The chamber 2 may include the window 21, a laser light concentration optical system 22a, a damper 44, and a window 43. The window 21 may be provided at the wall of the chamber 2. The window 21, the laser light concentration optical system 22a, and the damper 44 may be disposed in this order, in an optical path of the pulsed laser light 31 outputted from the laser unit 3, along a traveling direction of the pulsed laser light 31.

The window 21 may be a diamond window that allows the $CO_2$ laser light to be transmitted therethrough. The window 43 may be so disposed at the wall of the chamber 2 as to allow the image of plasma emission, to be generated at a beam waist of the pulsed laser light 31 derived from the laser light concentration optical system 22a, to be measured by the camera 40 from a position out of the optical path of the pulsed laser light 31. For example, the window 43 may be so disposed as to allow the image of the plasma emission, to be generated at the beam waist of the pulsed laser light 31, to be measured by the camera 40 from a direction substantially orthogonal to an optical path axis of the pulsed laser light 31. The beam waist of the pulsed laser light 31 may be set in the plasma generation region 25, or may be set in the vicinity of the plasma generation region 25.

The laser light concentration optical system 22a may be a condenser lens through which the pulsed laser light 31 may be transmitted. The laser light concentration optical system 22a may be an optical system including a combination of a plurality of lenses that each may be made of a material such as, but not limited to, ZnSe. Alternatively, the laser light concentration optical system 22a may be an optical system including a combination of a plurality of mirrors. The resolving power of the laser light concentration optical system 22a may be so set as to fall in a range from 70 μm to 300 μm.

The chamber 2 may be filled with, as a predetermined gas, an inert gas 37 set at predetermined pressure. For example, the inert gas 37 may be an Ar gas, and may be at predetermined pressure in a range from 8 kPa to 140 kPa. The pressure of the inert gas 37 may be adjusted based on a light intensity of the pulsed laser light 31.

The measurement controller 53 may output a signal on the oscillation trigger TG1 to the laser unit 3 and the delay circuit 71. The delay circuit 71 may output a signal to the one-shot circuit 72. The one-shot circuit 72 may output, to an image sensor 41, a signal on a shutter trigger TG2 with a predetermined pulse width.

The camera 40 may include a transfer optical system 42 and the image sensor 41. The transfer optical system 42 and the image sensor 41 may be so disposed as to allow the image of the plasma emission, generated at the beam waist of the pulsed laser light 31, to be formed on a light-receiving surface of the image sensor 41. The transfer optical system 42 may be configured by combination lenses with the resolving power that allows for measurement of a beam diameter of the concentrated beam of the pulsed laser light 31. The image sensor 41 may be a charge-coupled device (CCD) with an image intensifier. The image sensor 41 may be provided with a high-speed shutter, and may be provided with a function of opening the shutter for predetermined time and closing the shutter in response to the signal on the shutter trigger TG2.

The image sensor 41 and the measurement controller 53 may be so coupled as to allow image data D1 on the image, picked up by the image sensor 41, to be sent to the measurement controller 53. The image data D1 may include the plasma emission image data.

The camera 40 may be provided at a position out of the optical path of the pulsed laser light 31. The camera 40 may be provided with a function of picking up the image of the plasma emission generated inside the chamber 2 as a result of irradiation of the inert gas 37 with the pulsed laser light 31, for example. The camera 40 may be so disposed as to be oriented in a direction substantially orthogonal to the optical path axis of the pulsed laser light 31. The plasma emission image to be picked up by the camera 40 may be as illustrated by way of example in FIG. 3.

The measurement controller 53 may be provided with a function as a measuring section that may measure, based on the image data D1 obtained from the camera 40, a concentration position and a concentration width of the pulsed laser light 31. For example, the measurement controller 53 may measure the concentration position and the concentration width on the basis of the image data D1, by defining that the concentration position and the concentration width of the concentrated beam may respectively be a beam waist position Pw and a beam waist full width Dw, as illustrated in FIG. 3.

3.2 Operation

3.2.1 Overall Operation

Figure 4:
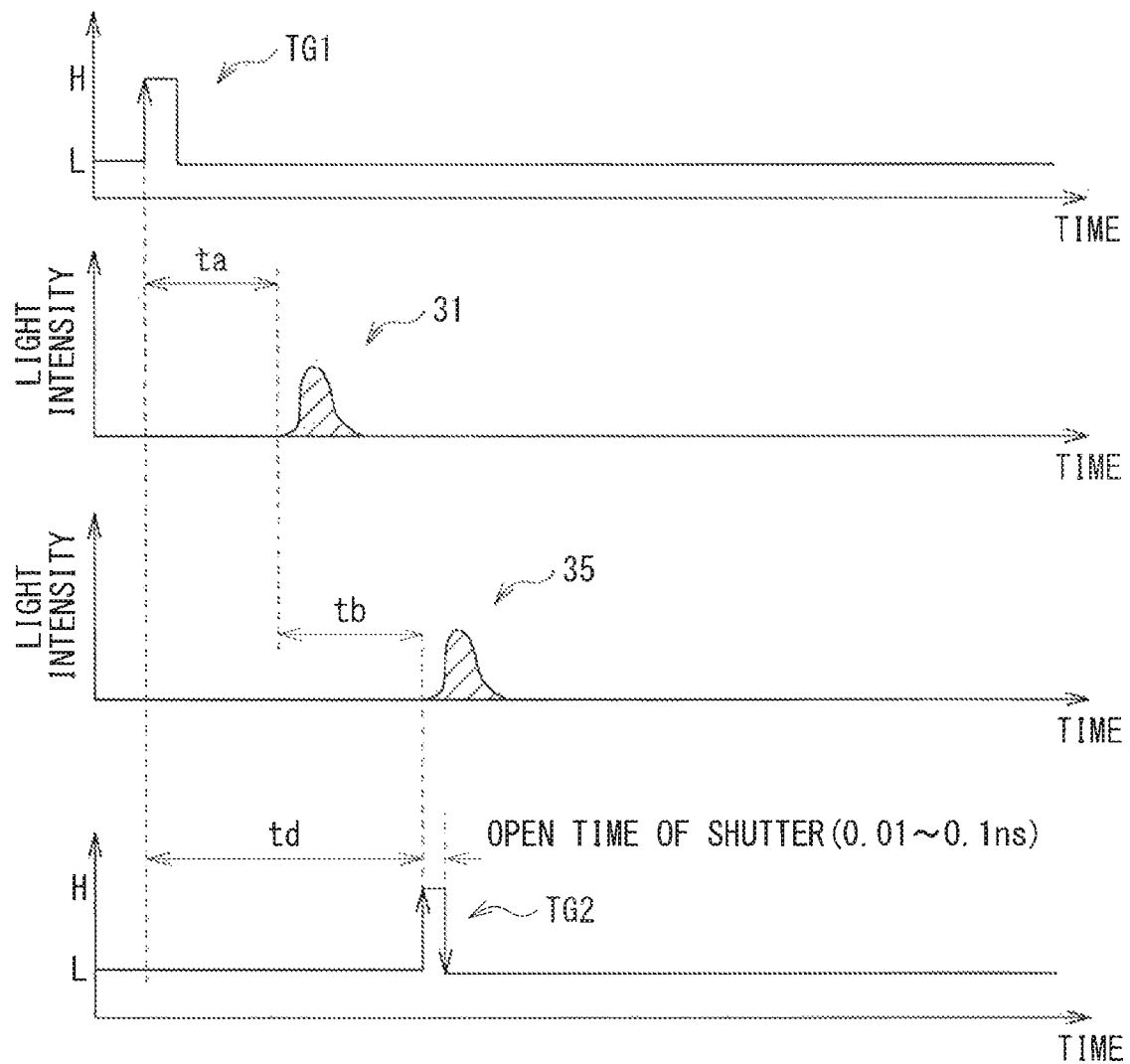
FIG. 4 is a timing chart illustrating examples of an oscillation trigger, pulsed laser light, plasma emission light, and a shutter trigger upon measuring the concentrated beam.

FIG. 4 illustrates examples of the oscillation trigger TG1, the pulsed laser light 31, plasma emission light 35, and the shutter trigger TG2 upon measurement of the concentrated beam. A description is given, with reference to the timing chart illustrated in FIG. 4 on an as-needed basis, of an overall operation performed upon the measurement of the concentrated beam of the pulsed laser light 31.

Referring to FIG. 2, when the laser unit 3 receives the oscillation trigger TG1, the laser unit 3 may output the pulsed laser light 31 with a wavelength of, for example but not limited to, 10.6 µm. The pulsed laser light 31 may be transmitted through the window 21 to enter the chamber 2, following which the pulsed laser light 31 may be concentrated at a beam waist position by the laser light concentration optical system 22a. The beam waist may be formed by the laser light concentration optical system 22a. The pulsed laser light 31 may be concentrated in the inert gas 37 as the predetermined gas. The plasma may be generated when a light intensity of the concentrated pulsed laser light 31 exceeds a predetermined light intensity, which generation may result in generation of the plasma emission light 35. The inert gas 37 may be, for example but not limited to, the Ar gas. The camera 40 may pick up the image of the plasma emission generated from the plasma. The image data D1 derived from the camera 40 may be obtained as illustrated by way of example in FIG. 3. The obtained image data D1 may be sent from the camera 40 to the measurement controller 53. The measurement controller 53 may calculate the beam waist full width Dw and the beam waist position Pw, based on the image data D1.

The measurement controller 53 may cause timing at which the camera 40 picks up the image to be synchronized with timing that is delayed from timing at which the laser unit 3 outputs the pulsed laser light 31. To this end, the measurement controller 53 may control the delay circuit 71 and the one-shot circuit 72. The measurement controller 53 may output the oscillation trigger TG1 as a pulse signal to the laser unit 3 and the delay circuit 71. This may result in output of the pulsed laser light 31 from the laser unit 3 after elapse of predetermined delay time "ta", following which the pulsed laser light 31 may reach, after elapse of time "tb", a region in the vicinity of the position of beam waist formed by the laser light concentration optical system 22a. From the delay circuit 71, an electric pulse signal may be outputted after elapse of predetermined delay time "td" from the input of the pulse signal on the oscillation trigger TG1. The one-shot circuit 72 may receive the electric pulse signal. The signal on the shutter trigger TG2 with a predetermined pulse width may be outputted from the one-shot circuit 72 to the camera 40.

The predetermined delay time td may be so set as to be the sum of the time ta and the time tb. The time ta may be a time period from timing at which the laser unit 3 receives the oscillation trigger TG1 up to timing at which the pulsed laser light 31 is outputted from the laser unit 3. The time tb may be a time period from the timing at which the pulsed laser light 31 is outputted from the laser unit 3 up to timing at which the outputted pulsed laser light 31 reaches the position of the beam waist formed by the laser light concentration optical system 22a.

For example, the following may be established:

$$tb = L/c$$

where L is an optical path length from the laser unit 3 to the position of the beam waist formed by the laser light concentration optical system 22a, and c is the light speed.

Also, the following may be established:

$$td = ta + tb$$

where td is the delay time of timing of the output of the shutter trigger TG2 from the timing at which the laser unit 3 receives the oscillation trigger TG1.

It is to be noted that the plasma may diffuse into space immediately after its generation, and a light emission region may expand accordingly. Hence, time elapsed from the generation of the plasma as well as time during which the shutter is open both may influence a measurement accuracy upon measuring the beam waist full width Dw and the beam waist position Pw. For example, the speed of diffusion of the plasma of $10^5$ m/s and the open time of the shutter of 0.01 ns may expand the light emission region by 1 μm. In an example case where a diameter of the beam waist is assumed to be, for example but not limited to, 300 μm, the measurement accuracy may be set to about 30 μm as the accuracy 10% of the diameter. To achieve such measurement accuracy, the delay circuit 71 may so set the delay time as to be td, and the open time of the shutter of the camera 40 may be so set as to cause the shutter to be open for, for example but not limited to, 0.3 ns and closed thereafter. In an example case where the measurement accuracy of 1 μm is necessary, the open time of the shutter may be set to 0.01 ns. Further, in an example case where the diameter of the beam waist to be measured is assumed to be 1000 μm and the measurement accuracy of 100 μm is thus desirable, the open time of the shutter may be set to 1 ns. The open time of the shutter may be defined by the pulse width of the signal on the shutter trigger TG2 outputted by the one-shot circuit 72.

3.2.2 Main Flow of Measurement Controller

Figure 5:
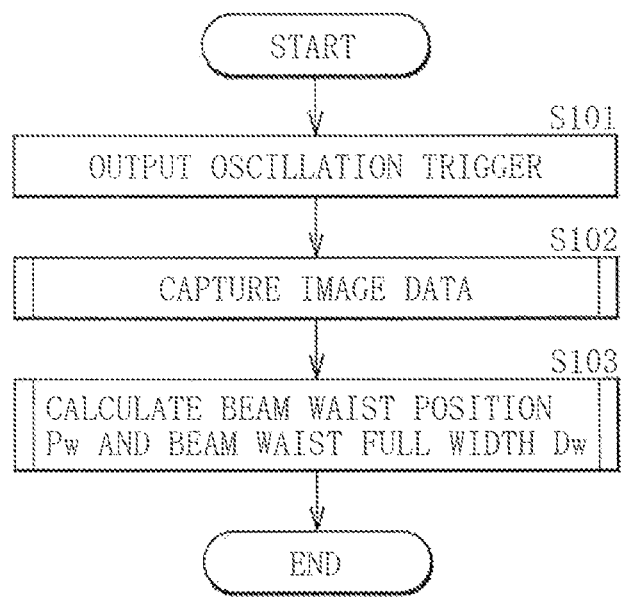
FIG. 5 is a flowchart illustrating an example of a main processing operation performed by a measurement controller.

FIG. 5 illustrates an example of a main processing operation performed by the measurement controller 53. The measurement controller 53 may output the signal on the oscillation trigger TG1 to the laser unit 3 and the delay circuit 71 (step S101). Then, the measurement controller 53 may perform a process of capturing the image data D1 derived from the camera 40 (step S102). Then, the measurement controller 53 may calculate, based on the image data D1, the beam waist position Pw and the beam waist full width Dw (step S103).

3.2.3 Process of Capturing Image Data D1

Figure 6:
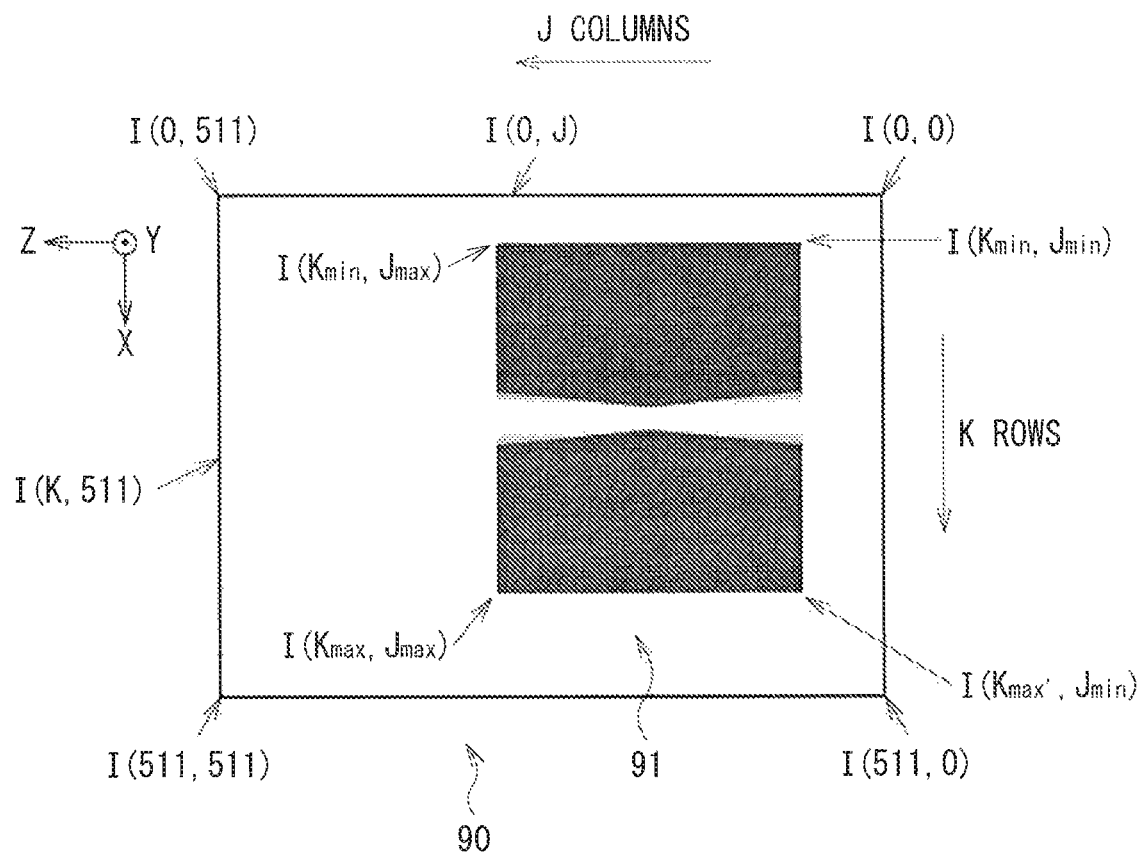
FIG. 6 illustrates an example of a range in which image data is to be captured upon measuring the concentrated beam.
Figure 7:
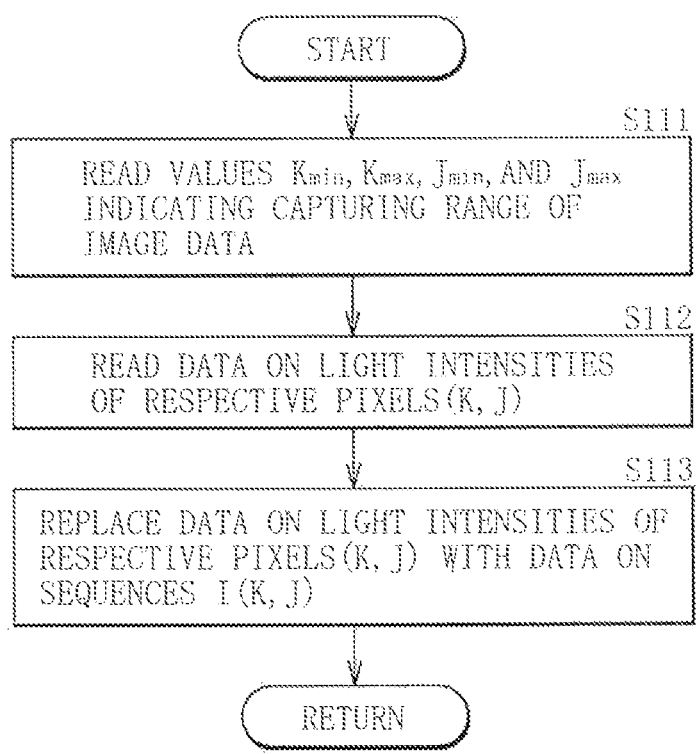
FIG. 7 is a flowchart illustrating an example of a subroutine of the capturing process of the image data.

FIG. 7 illustrates an example of the capturing process, illustrated in FIG. 5, of the image data D1. The capturing process illustrated in FIG. 7 may be performed, by the measurement controller 53, as a subroutine of the step S102 illustrated in FIG. 5. FIG. 6 illustrates an example of a range in which the image data D1 is to be captured.

Referring to FIG. 6, the measurement controller 53 may cut out, from the image picked up by the camera 40, data in a predetermined designated region 91 to capture the cut out data as the image data D1. This may reduce a data size of the captured image data, and may thus speed up processing time. In an example case where a position of the beam waist is largely out of the designated region 91, data in the entire image size region 90 may be captured as the image data D1.

The image data D1 may be, for example but not limited to, bitmap data. The bitmap data may be data in which an image is divided into a large number of pixels in a grid-like pattern and a light intensity of each of such pixels is expressed by a numerical value. For example, as illustrated in FIG. 6, numbers in column and numbers in row may respectively be expressed in "J" and "K", where the column numbers may be defined by counting the pixels in a horizontal direction from the upper right corner of the bitmap image data, the row numbers may be defined by counting the pixels in a vertical direction from the upper right corner, and the upper right corner may be defined as the origin I (0, 0). Pixel at specific positions each may be specified by the column number J and the row number K, and may be expressed in (K, J). The light intensity of each of such pixels (K, J) may be expressed in $I_{(K, J)}$. The image sensor 41 may include, for example but not limited to, 512 columns by 512 rows of pixels, i.e., 262,144 pixels. In this example case, values of the column numbers J may be integers in a range from 0 to 511, and values of the row numbers K may be integers in a range from 0 to 511.

The measurement controller 53 may read values that indicate a capturing range of the image data (step S111), when the capturing range of the image data, such as a capturing range indicated by the designated region 91 illustrated in FIG. 6, is designated. The values indicating the capturing range may be given by a minimum value ($J_{min}$) and a maximum value ($J_{max}$) among the column numbers J and by a minimum value ($K_{min}$) and a maximum value ($K_{max}$) among the row numbers K. For example, in an example case where the entire image size region 90 includes 512 columns by 512 rows of pixels, values of $J_{min}$ and $J_{max}$ may be integers in a range of $0 \leq J_{min} < J_{max} \leq 511$, and values of $K_{min}$ and $K_{max}$ may be integers in a range of $0 \leq K_{min} < K_{max} \leq 511$. The values of $J_{min}$, $J_{max}$, $K_{min}$, and $K_{max}$ to be read may be always constant, or may be varied depending on a situation.

Then, the measurement controller 53 may read, from the image data D1 on the picked up image, data on the light intensities of the respective pixels (K, J) in the predetermined capturing range (step S112). In an example illustrated in FIG. 6, the measurement controller 53 may read data $I_{(K, J)}$ on the light intensities of respective four pixels, namely, a pixel ($K_{min}$, $J_{min}$), a pixel ($K_{min}$, $J_{max}$), a pixel ($K_{max}$, $J_{max}$), and a pixel ($K_{max}$, $J_{min}$), as well as the data $I_{(K, J)}$ on the light intensities of respective pixels in the range surrounded by those four pixels, for example. The range from which the data on the light intensities of the pixels are to be read is limited in this way. Reading the data on the light intensities of the pixels in such a limited range may allow for speeding up of subsequent processes.

Then, the measurement controller 53 may perform a process of replacing the data on the light intensities of the respective pixels (K, J) with data on predefined sequences I(K, J) (step S113). The data $I_{(K, J)}$ on the respective light intensities of the pixels may be data in 8 bits to 10 bits (for example, 0 to 1024). The measurement controller 53 may end the subroutine, i.e., the flowchart illustrated in FIG. 7, after performing the process of replacing the data on the light intensities of the respective pixels (K, J) with the data on the sequences I(K, J).

3.2.4 Calculation of Beam Waist Position Pw and Beam Waist Full Width Dw

Figure 8:
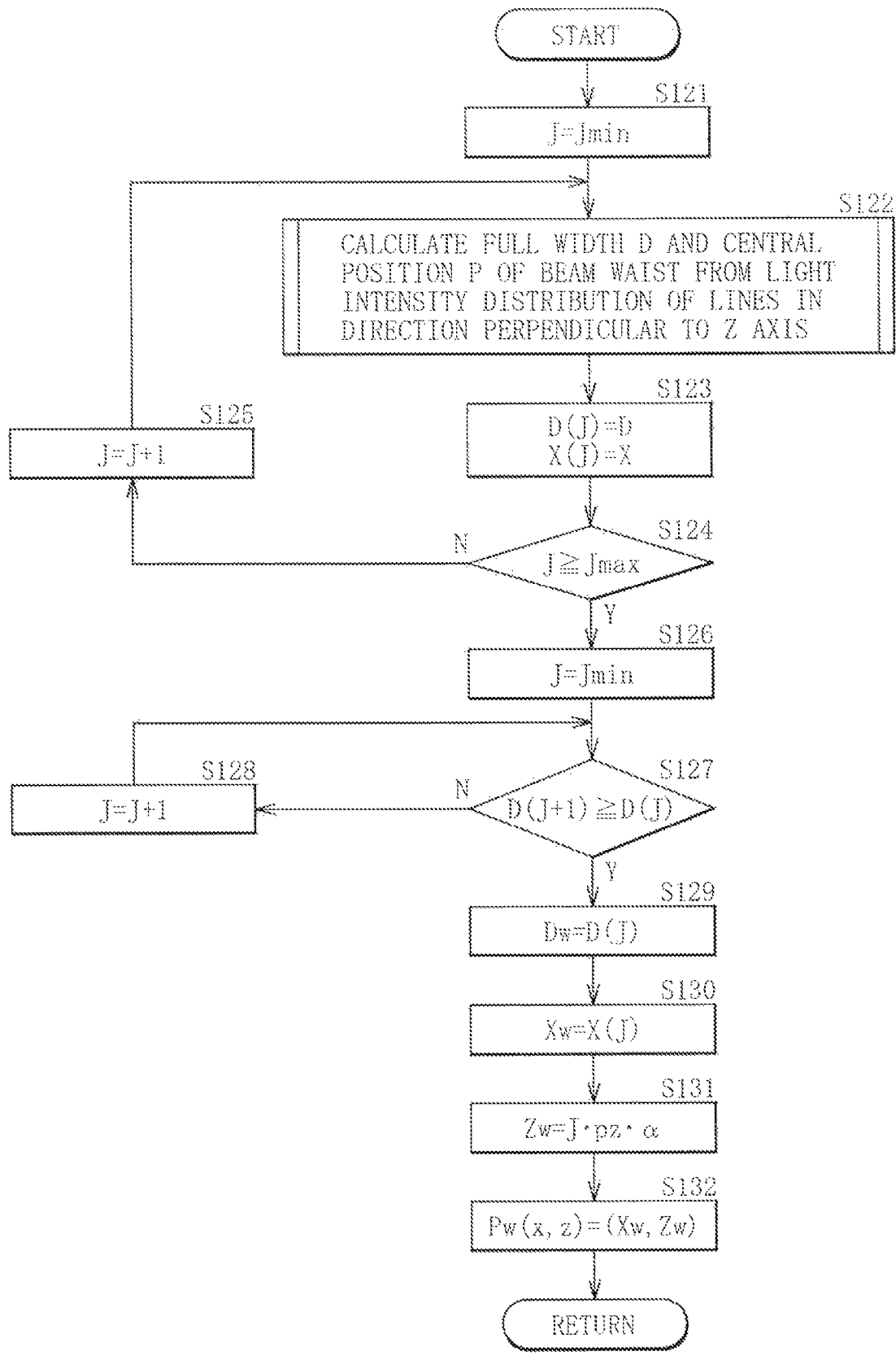
FIG. 8 is a flowchart illustrating an example of a subroutine of a process for calculating a beam waist position and a beam waist full width.
Figure 9:
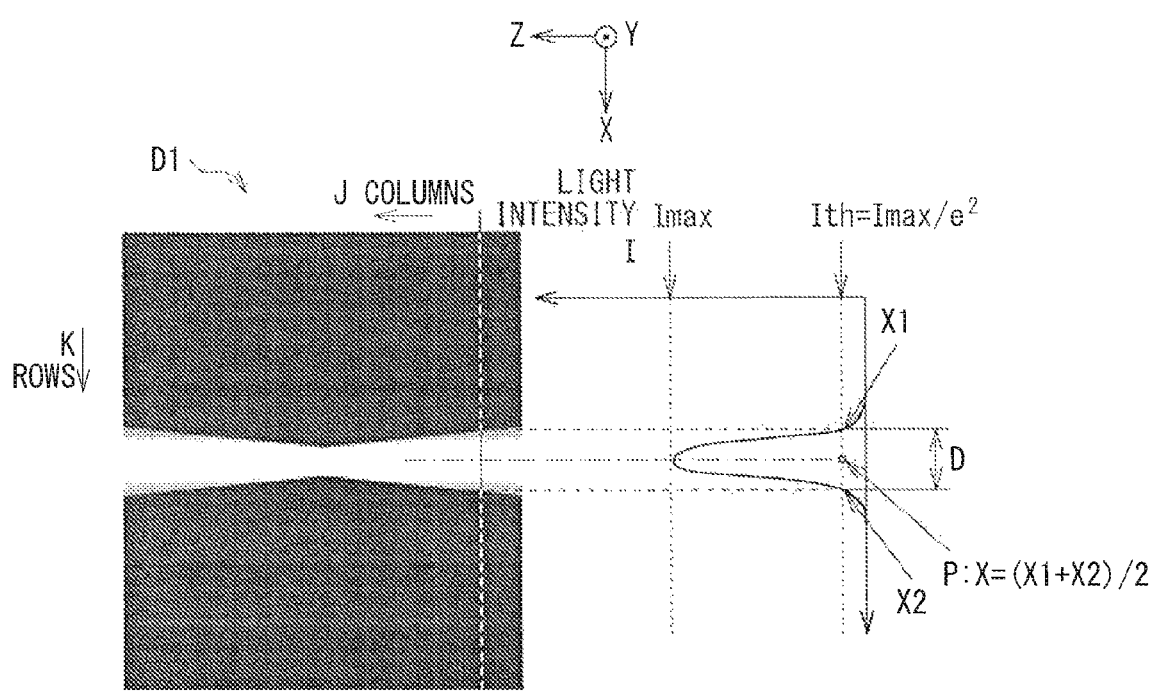
FIG. 9 describes an example of one stage in the calculation of the beam waist position and the beam waist full width.

FIG. 8 illustrates an example of the process, illustrated in FIG. 5, of calculating the beam waist position Pw and the beam waist full width Dw. The calculating process illustrated in FIG. 8 may be performed, by the measurement controller 53, as a subroutine of the step S103 illustrated in FIG. 5. FIG. 9 describes an example of one stage in the calculation of the beam waist position Pw and the beam waist full width Dw, and illustrates an example of a light intensity distribution in a direction perpendicular to a Z axis (i.e., in a direction of the J columns) in the image data D1.

The measurement controller 53 may set the column number J to $J_{min}$ (step S121). Then, the measurement controller 53 may calculate, from a distribution of the light intensity data $I_{(K, J)}$ in the J column, a central position P of the beam waist and a beam waist full width D in the current column number J as illustrated in FIG. 9 (step S122). The beam waist full width D may be calculated based on a position at which a value defined by $1/e^2$ of a maximum value $I_{max}$ of the light intensity in the J column is obtained, as illustrated in FIG. 9. Then, the measurement controller 53 may perform a process of replacing a value X of the calculated central position P with data on a predefined sequence X(J), and of replacing a value of the beam waist full width D with data on a predefined sequence D(J) (step S123). Then, the measurement controller 53 may make a determination as to whether the current column number J has reached the maximum value $J_{max}$ among the column numbers J in the capturing range of the image data illustrated in FIG. 6 (step S124). When the measurement controller 53 determines that the current column number J has not reached the maximum value $J_{max}$ (step S124: N), the measurement controller 53 may add 1 (one) to the current column number J to update a value of a counter of the column number J (step S125), and may calculate the central position P of the beam waist and the beam waist full width D again (step S122).

When the measurement controller 53 determines that the current column number J has reached the maximum value $J_{max}$ (step S124: Y), the measurement controller 53 may reset the column number J to the minimum value $J_{min}$ (step S126). Then, the measurement controller 53 may make a determination as to whether a value of the sequence D(J) is equal to or less than a value of a sequence D(J+1) (step S127). When the measurement controller 53 determines that the value of the sequence D(J) exceeds the value of the sequence D(J+1) (step S127: N), the measurement controller 53 may add 1 (one) to the current column number J to update the value of the counter of the column number J (step S128), and may make the determination as to whether the value of the sequence D(J) is equal to or less than the value of the sequence D(J+1) again (step S127). In this way, in order to obtain a minimum value in the sequence D(J), the measurement controller 53 may perform a process of comparing the values.

When the measurement controller 53 determines that the value of the sequence D(J) is equal to or less than the value of the sequence D(J+1) (step S127: Y), the measurement controller 53 may determine that the value of the beam waist full width D in the current column number J is the minimum value, and may perform a process of replacing the value of the sequence D(J) with the beam waist full width Dw (step S129). Further, the measurement controller 53 may perform a process of replacing a value of the sequence X(J) in the current column number J with a position Xw in an X direction of the beam waist (step S130). Moreover, the measurement controller 53 may perform a process of calculating a position Zw in a Z direction of the beam waist in the current column number J, based on the following expression (step S131):

$$Zw = J \cdot pz \cdot \alpha$$

where pz may be a pitch width per pixel in the Z direction of the image data D1, and $\alpha$ may be a value corresponding to magnification of the transfer optical system 42 of the camera 40. For example, $\alpha$ may be equal to 1 (one) when the magnification of the transfer optical system 42 is 1-fold magnification.

Then, the measurement controller 53 may respectively replace the thus-calculated positions Xw and Zw with x and z to calculate a beam waist position Pw(x, z) (step S132), and may end the subroutine, i.e., the flowchart illustrated in FIG. 8, thereafter. Here, (x, z) may be coordinates in the x and z directions.

Figure 10:
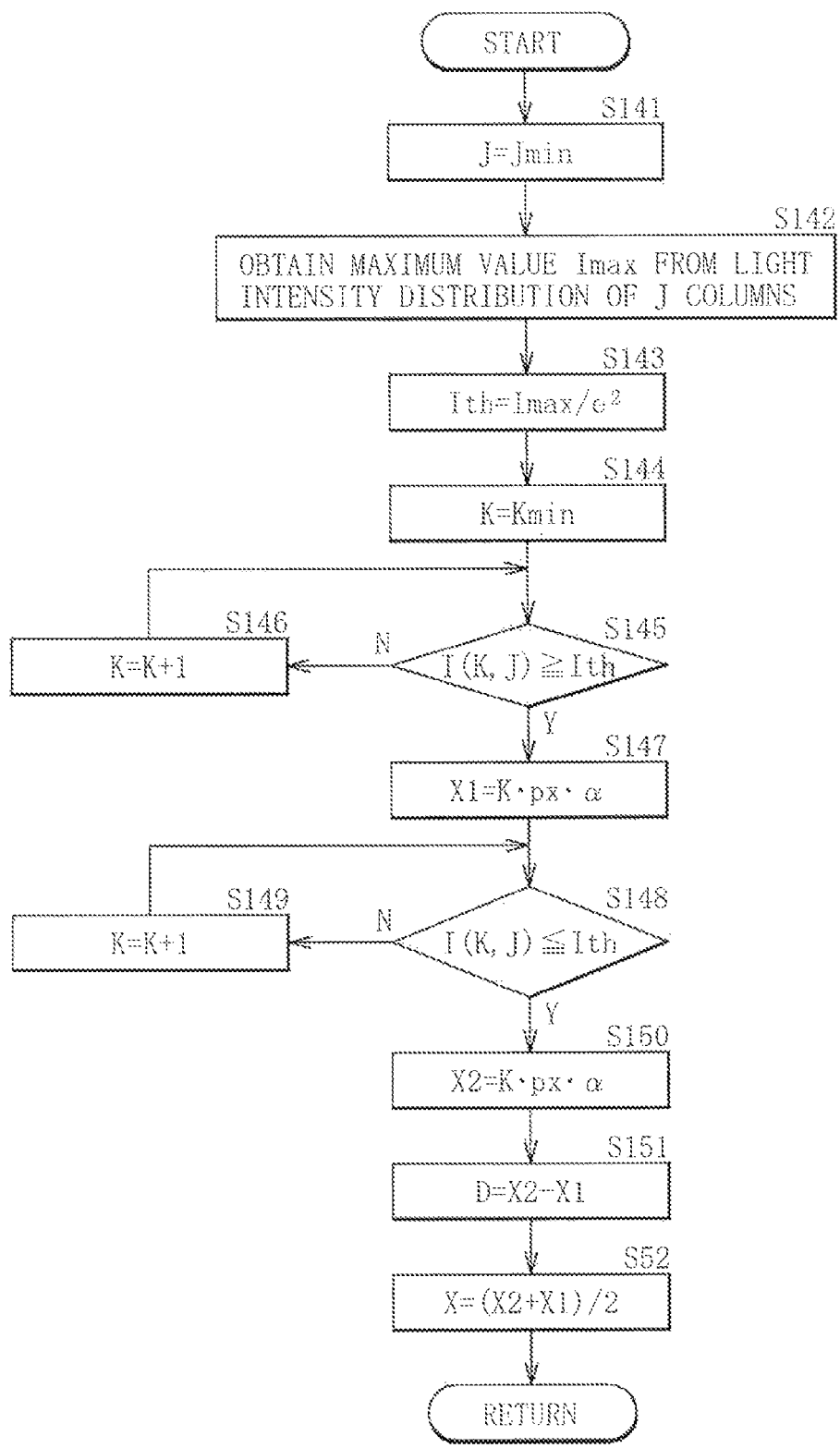
FIG. 10 is a flowchart illustrating an example of a subroutine for calculating a central position and the full width of the beam waist.

FIG. 10 illustrates an example of the process, illustrated in FIG. 8, of calculating the central position P of the beam waist and the beam waist full width D. The calculating process illustrated in FIG. 10 may be performed, by the measurement controller 53, as a subroutine of the step S122 illustrated in FIG. 8.

The measurement controller 53 may set the column number J to $J_{min}$ (step S141). Then, the measurement controller 53 may obtain the maximum value $I_{max}$ from a light intensity distribution of the J column (step S142). Then, the measurement controller 53 may obtain the value $(I_{max}/e^2)$ defined by $1/e^2$ of the maximum value $I_{max}$ of the light intensity in the J column, and may calculate a threshold Ith used to make a determination, as illustrated by way of example in FIG. 9, on the position of the beam waist, based on the following expression (step S143):

$$Ith = I_{max}/e^2$$

Then, the measurement controller 53 may set the row number K to $K_{min}$ (step S144). Then, the measurement controller 53 may make a determination as to whether the light intensity $I_{(K, J)}$ at the row number K and the column number J is equal to or greater than the threshold Ith (step S145). When the measurement controller 53 determines that the light intensity $I_{(K, J)}$ at the row number K and the column number J is not equal to or greater than the threshold Ith (step S145: N), the measurement controller 53 may add 1 (one) to the current row number K to update a value of a counter of the row number K (step S146), and may make the determination as to whether the light intensity $I_{(K, J)}$ at the row number K and the column number J is equal to or greater than the threshold Ith again (step S145).

When the measurement controller 53 determines that the light intensity $I_{(K, J)}$ at the row number K and the column number J is equal to or greater than the threshold Ith (step S145: Y), the measurement controller 53 may perform a process of calculating an upper end position X1, as illustrated by way of example in FIG. 9, of the beam waist, based on the following expression (step S147):

$$X1 = K \cdot px \cdot \alpha$$

where px may be a pitch width per pixel in the X direction of the image data D1, and $\alpha$ may be the value corresponding to the magnification of the transfer optical system 42 of the camera 40. For example, $\alpha$ may be equal to 1 (one) when the magnification of the transfer optical system 42 is 1-fold magnification.

Then, the measurement controller 53 may make a determination as to whether the light intensity $I_{(K, J)}$ at the row number K and the column number J is equal to or less than the threshold Ith (step S148). When the measurement controller 53 determines that the light intensity $I_{(K, J)}$ at the row number K and the column number J is not equal to or less than the threshold Ith (step S148: N), the measurement controller 53 may add 1 (one) to the current row number K to update the value of the counter of the row number K (step S149), and may make the determination as to whether the light intensity $I_{(K, J)}$ at the row number K and the column number J is equal to or less than the threshold Ith again (step S148).

When the measurement controller 53 determines that the light intensity $I_{(K, J)}$ at the row number K and the column number J is equal to or less than the threshold Ith (step S148: Y), the measurement controller 53 may perform a process of calculating a lower end position X2, as illustrated by way of example in FIG. 9, of the beam waist, based on the following expression (step S150):

$$X2 = K \cdot px \cdot \alpha$$

where px may be the pitch width per pixel in the X direction of the image data D1, and $\alpha$ may be the value corresponding to the magnification of the transfer optical system 42 of the camera 40. For example, α may be equal to 1 (one) when the magnification of the transfer optical system 42 is 1-fold magnification.

Then, the measurement controller 53 may perform a process of calculating the beam waist full width D as illustrated by way of example in FIG. 9, based on the expression "D=X2−X1" (step S151).

Then, the measurement controller 53 may perform a process of calculating the central position P of the beam waist as illustrated by way of example in FIG. 9, based on the expression "X=(X2+X1)/2" (step S152), and may end the subroutine, i.e., the flowchart illustrated in FIG. 10.

3.3 Action

The concentrated pulsed laser light beam measuring apparatus according to the first embodiment may cause the pulsed laser light 31 to be concentrated in the inert gas 37 to generate the plasma, and pick up the image of the plasma emission by the camera 40 that may include the high-speed shutter. This may make it possible to measure a state of propagation of the concentrated beam of the pulsed laser light 31 as an image as illustrated in FIG. 3.

This measurement may allow for the calculation of at least the beam waist full width Dw and the beam waist position Pw from the image data D1 derived from one pulse of the pulsed laser light 31. The measurement may eliminate the necessity of moving, for example, the laser light concentration optical system 22a or the image sensor 41 in the Z direction to perform a measurement of a beam profile at a plurality of positions along the optical path axis of the pulsed laser light 31, and thereby eliminate the necessity of measuring a cross-section of the beam waist multiple times.

3.4 First Modification Example of First Embodiment

Modification Example on Generation of Shutter Trigger TG2

3.4.1 Configuration

In the example configuration illustrated in FIG. 2, the oscillation trigger TG1 outputted from the measurement controller 53 is branched into the oscillation triggers to be supplied to the respective laser unit 3 and delay circuit 71. Alternatively, a signal may be supplied from the laser unit 3 to the delay circuit 71 to generate the signal on the shutter trigger TG2 as illustrated in FIG. 11.

Figure 11:
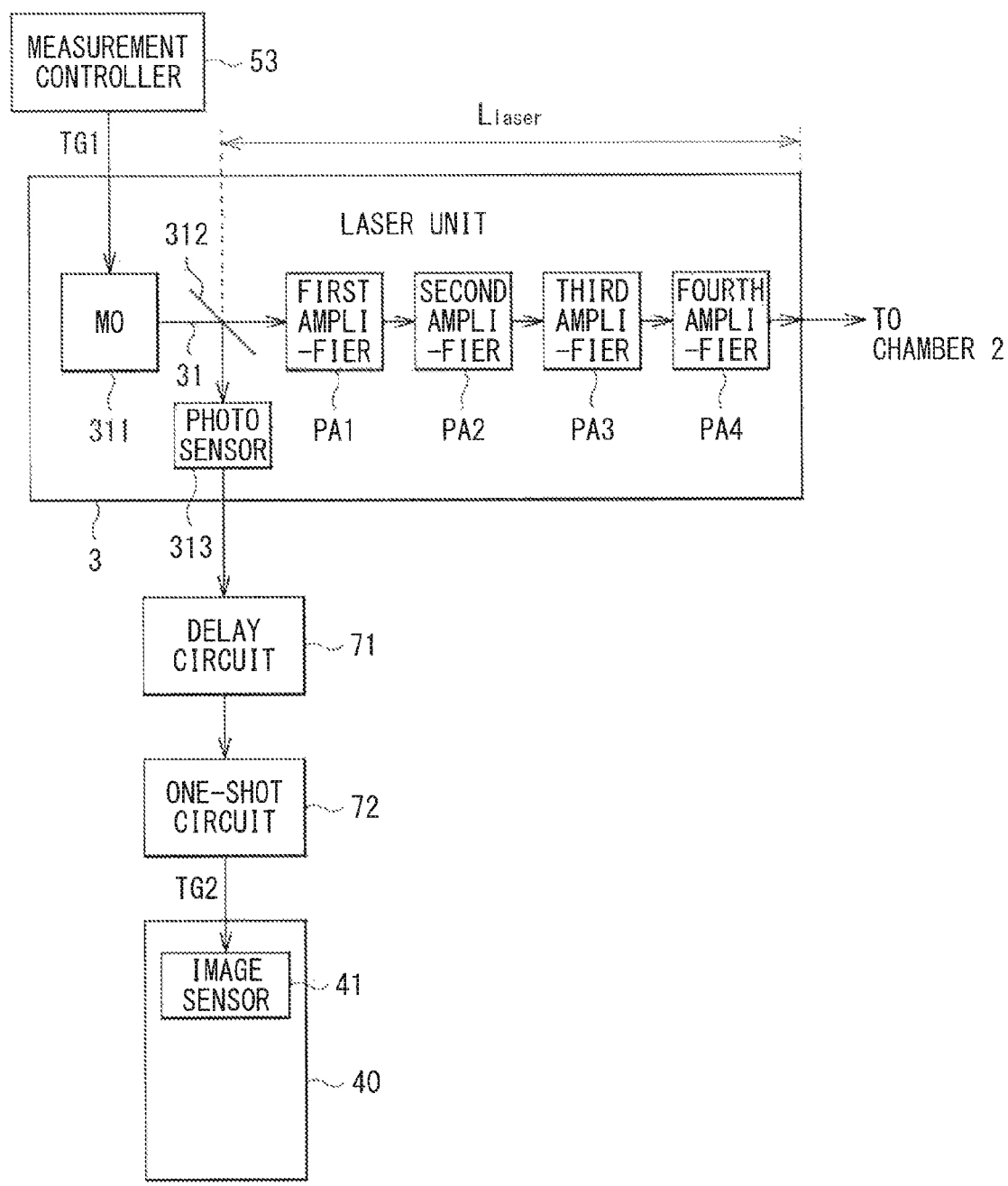
FIG. 11 illustrates a modification example on generation of the shutter trigger.

Referring to FIG. 11, the laser unit 3 may include a master oscillator (MO) 311, a plurality of amplifiers, a beam splitter 312, and a photosensor 313. The plurality of amplifiers may be configured by, for example but not limited to, a first amplifier PA1, a second amplifier PA2, a third amplifier PA3, and a fourth amplifier PA4.

The master oscillator 311 may be a laser unit that performs oscillation at an amplification wavelength range of a $CO_2$ laser. The master oscillator 311 may be a laser oscillator that includes, for example but not limited to, a quantum cascade laser and a Q switch. The first amplifier PA1, the second amplifier PA2, the third amplifier PA3, and the fourth amplifier PA4 may be disposed in the optical path of the pulsed laser light 31 outputted from the master oscillator 311, and each may be an amplifier that contains a $CO_2$ laser gas.

The beam splitter 312 may be disposed in an optical path between the master oscillator 311 and the first amplifier PA1. The beam splitter 312 may include a configuration in which a substrate that allows the pulsed laser light 31 to be transmitted therethrough is coated with a film. The film may allow part of light outputted from the master oscillator 311 to be reflected therefrom and allow part of the light to be transmitted therethrough.

The photosensor 313 may detect the light reflected from the beam splitter 312. The photosensor 313 may be a pyroelectric sensor, and may include an unillustrated circuit that outputs an electric pulse signal.

The delay time td of the delay circuit 71 may be a value in which the sum of $L_{laser}$ and L is divided by the light speed c as represented by the following expression:

$$td=(L_{laser}+L)/c$$

where $L_{laser}$ may be an optical path length from a position of the beam splitter 312 to a position at which the pulsed laser light 31 of the laser unit 3 is outputted, and L may be a distance from the laser unit 3 to the beam waist. For example, the delay time td may be equal to 76.7 ns when the optical path length $L_{laser}$ is 200 m and the distance L is 30 m.

3.4.2 Operation

When the master oscillator 311 receives the oscillation trigger TG1 from the measurement controller 53, the master oscillator 311 may output the pulsed laser light 31. The pulsed laser light 31 may enter the beam splitter 312, where part of the pulsed laser light 31 may be reflected by the beam splitter 312 to enter the photosensor 313. Part of the pulsed laser light 31 having been transmitted through the beam splitter 312 may pass through the first to the fourth amplifiers PA1 to PA4 to be subjected to amplification.

When the pulsed laser light 31 enters the photosensor 313, the photosensor 313 may output the electric pulse signal to the delay circuit 71, in response to timing at which the pulsed laser light 31 has entered the photosensor 313. The delay circuit 71 may output, to the one-shot circuit 72, an electric pulse signal that is delayed from the received electric pulse signal by the delay time td. The one shot circuit 72 may output the signal on the shutter trigger TG2 with the predetermined pulse width to the image sensor 41 of the camera 40.

3.4.3 Action

In the first modification example of the first embodiment, the signal on the shutter trigger TG2 may be generated on the basis of the timing of the actual entrance of the pulsed laser light 31 outputted from the master oscillator 311 into the photosensor 313. This may consequently make it possible to control, with a high degree of accuracy, opening-closing timing of the shutter of the image sensor 41 with respect to timing of the plasma emission to be generated at the beam waist of the pulsed laser light 31. This may be effective especially when there is a presence of non-negligible jitter at the output timing of the pulsed laser light 31 to be outputted from the master oscillator 311 with respect to the oscillation trigger TG1.

Note that the beam splitter 312 is disposed in the optical path between the master oscillator 311 and the first amplifier PA1 in the non-limiting example configuration illustrated in FIG. 11. Alternatively, the beam splitter 312 may be disposed at any other position. For example, the beam splitter 312 may be disposed in an optical path between the first amplifier PA1 and the second amplifier PA2 to measure timing of the transmitted pulsed laser light 31. Alternatively, the beam splitter 312 may be disposed in an optical path between the second amplifier PA2 and the third amplifier PA3, in an optical path between the third amplifier PA3 and the fourth amplifier PA4, in an optical path of an final output of the laser unit 3, or in an optical path between the laser unit 3 and the beam waist. The delay time td of the delay circuit 71 may be made shorter as the beam splitter 312 is located closer in an optical path in which the beam splitter 312 is disposed to the beam waist.

3.5 Second Modification Example of First Embodiment

Example Embodiment in which Two Cameras are Provided

3.5.1 Configuration

Figure 12:
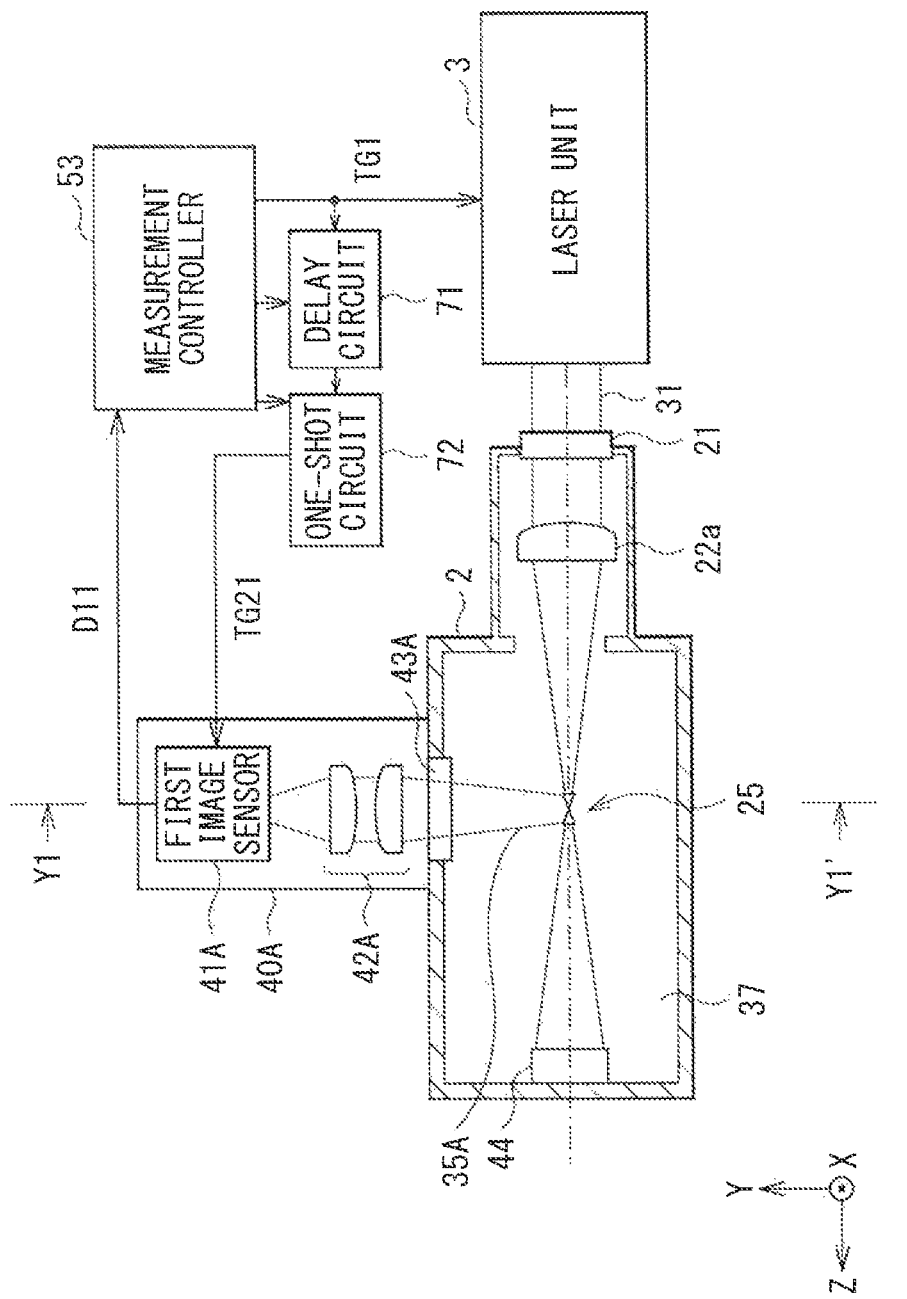
FIG. 12 schematically illustrates an example of a Y-Z cross-sectional configuration of a concentrated pulsed laser light beam measuring apparatus according to a second modification example of the first embodiment.
Figure 13:
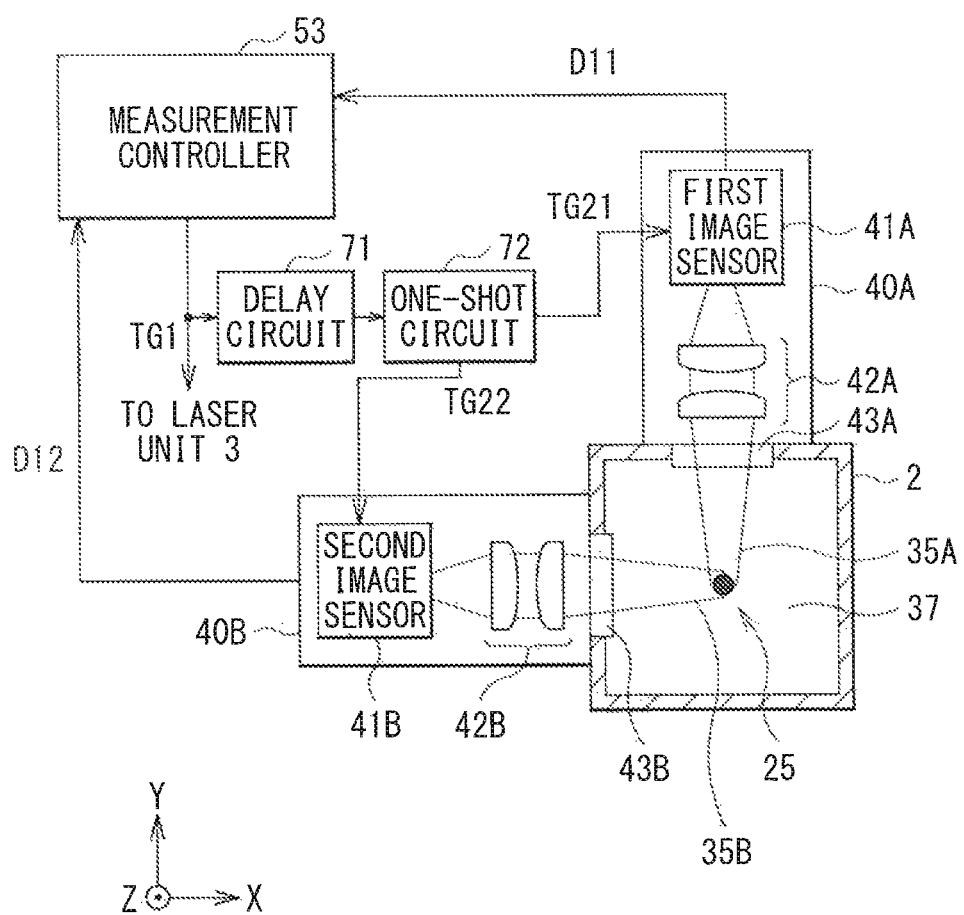
FIG. 13 schematically illustrates an example of a Y-X cross-sectional configuration of the concentrated pulsed laser light beam measuring apparatus according to the second modification example.

FIGS. 12 and 13 each illustrates an example of a configuration of a concentrated pulsed laser light beam measuring apparatus according to a second modification example of the first embodiment, in which FIG. 12 illustrates a Y-Z cross-sectional configuration and FIG. 13 illustrates a configuration in a Y-X cross-section that includes line Y1-Y1' of FIG. 12. In FIG. 2, illustrated is an example in which the single camera 40 is provided as an image pickup section for measuring the concentrated beam. However, a configuration may be employed in which two image pickup sections are provided as illustrated in FIGS. 12 and 13. The two image pickup sections may respectively include a first camera 40A and a second camera 40B.

The first camera 40A may include a configuration being virtually the same as the example configuration of the camera 40 illustrated in FIG. 2. The first camera 40A may include a first transfer optical system 42A and a first image sensor 41A. The second camera 40B may include a second transfer optical system 42B and a second image sensor 41B. The wall of the chamber 2 may be provided with a window 43A at a position corresponding to a position at which the first camera 40A is disposed. The wall of the chamber 2 may also be provided with a window 43B at a position corresponding to a position at which the second camera 40B is disposed.

The first camera 40A may be so disposed as to be oriented in a first direction, and the second camera 40B may be so disposed as to be oriented in a second direction different from the first direction. For example, the first direction may be a Y axis direction, and the second direction may be an X axis direction. The first camera 40A and the second camera 40B may be so disposed as to be oriented in respective directions orthogonal to each other. Also, the first camera 40A and the second camera 40B may each be so disposed as to be oriented in a direction orthogonal to the optical path of the pulsed laser light 31. The first camera 40A may pick up the plasma emission image from the first direction to output first image data D11 as first plasma emission image data. The second camera 40B may pick up the plasma emission image from the second direction to output second image data D12 as second plasma emission image data.

The one-shot circuit 72 may output a signal on a first shutter trigger TG21 with a predetermined pulse width to the first image sensor 41A, and may output a signal on a second shutter trigger TG22 with a predetermined pulse width to the second image sensor 41B. The first shutter trigger TG21 and the second shutter trigger TG22 may be the signals derived from branching of a virtually-identical signal into two. The first image sensor 41A and the measurement controller 53 may be so coupled as to allow the first image data D11 on an image, picked up by the first image sensor 41A, to be sent to the measurement controller 53. The second image sensor 41B and the measurement controller 53 may be so coupled as to allow the second image data D12 on an image, picked up by the second image sensor 41B, to be sent to the measurement controller 53.

The measurement controller 53 may be provided with a function of measuring, based on the first image data D11 obtained from the first camera 40A, a first concentration position and a first concentration width of the concentrated beam of the pulsed laser light 31. The first concentration position may be a first beam waist position Pxw, and the first concentration width may be a first beam waist full width Dxw. The measurement controller 53 may also be provided with a function of measuring, based on the second image data D12 obtained from the second camera 40B, a second concentration position and a second concentration width of the concentrated beam of the pulsed laser light 31. The second concentration position may be a second beam waist position Pyw, and the second concentration width may be a second beam waist full width Dyw.

3.5.2 Operation

When the laser unit 3 receives the oscillation trigger TG1, the laser unit 3 may output the pulsed laser light 31. The pulsed laser light 31 may be transmitted through the window 21 to enter the chamber 2. The pulsed laser light 31 may be concentrated at a beam waist position by the laser light concentration optical system 22a. The beam waist may be formed by the laser light concentration optical system 22a. The pulsed laser light 31 may be concentrated in the inert gas 37 as the predetermined gas. The plasma may be generated when a light intensity of the concentrated pulsed laser light 31 exceeds a predetermined light intensity, which generation may result in generation of the plasma emission light. The inert gas 37 may be, for example but not limited to, the Ar gas. The first camera 40A may pick up the image of first plasma emission light 35A observed from the first direction. The first image data D11 derived from the first camera 40A may be sent to the measurement controller 53. The measurement controller 53 may calculate the first beam waist position Pxw and the first beam waist full width Dxw, based on the first image data D11. The second camera 40B may pick up the image of second plasma emission light 35B observed from the second direction. The second image data D12 derived from the second camera 40B may be sent to the measurement controller 53. The measurement controller 53 may calculate the second beam waist position Pyw and the second beam waist full width Dyw, based on the second image data D12.

Figure 14:
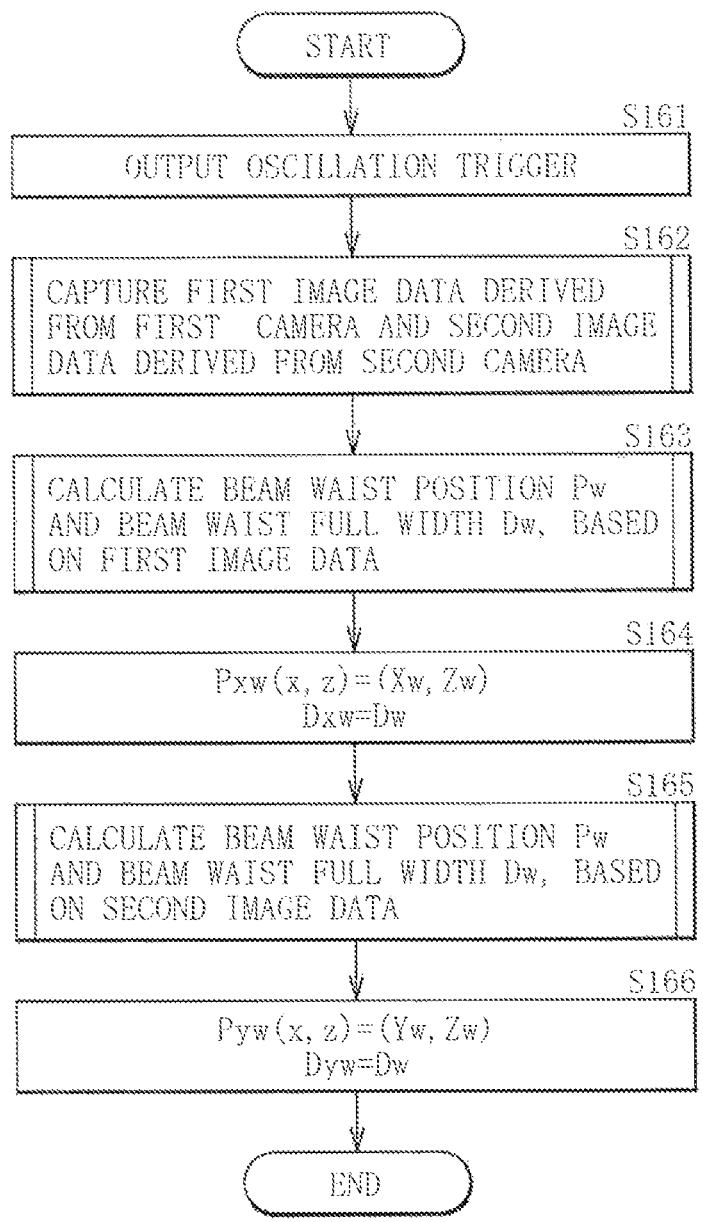
FIG. 14 is a flowchart illustrating an example of a processing operation performed by the measurement controller in the concentrated pulsed laser light beam measuring apparatus according to the second modification example.

FIG. 14 illustrates an example of a processing operation performed by the measurement controller 53. The measurement controller 53 may output the signal on the oscillation trigger TG1 to the laser unit 3 and the delay circuit 71 (step S161). Then, the measurement controller 53 may perform a process of capturing the first image data D11 derived from the first camera 40A and the second image data D12 derived from the second camera 40B (step S162). The process of capturing the first image data D11 may be virtually the same as the foregoing process illustrated in FIG. 7. The process of capturing the second image data D12 may be virtually the same as the foregoing process illustrated in FIG. 7, with the exception that replacement of coordinate systems is performed.

Then, the measurement controller 53 may execute processes being virtually the same as the foregoing processes illustrated in FIGS. 8 and 10 to calculate a beam waist position Pw(x, z)=(Xw, Zw) and the beam waist full width Dw, based on the first image data D11 (step S163). Then, the measurement controller 53 may perform a process of replacing the beam waist position Pw(x, z)=(Xw, Zw) with a first beam waist position Pxw(x, z) and replacing the beam waist full width Dw with the first beam waist full width Dxw (step S164).

Then, the measurement controller 53 may execute processes being virtually the same as the foregoing processes illustrated in FIGS. 8 and 10 by replacing the X coordinate in the process with a Y coordinate, to calculate a beam waist position Pw(y, z)=(Yw, Zw) and the beam waist full width Dw, based on the second image data D12 (step S165). Then, the measurement controller 53 may perform a process of replacing the beam waist position Pw(y, z)=(Yw, Zw) with a second beam waist position Pyw(y, z) and replacing the beam waist full width Dw with the second beam waist full width Dyw (step S166).

3.5.3 Action

In the second modification example of the first embodiment, the beam waist full width and the beam waist position may be measured for each of the X direction and the Y direction. This may make it possible to measure three-dimensional coordinate positions (x, y, z) of the beam waist position when the beam waist position in the X direction and that in the Y direction are coincident with each other. A case where the beam waist full width and the beam waist position are measured as being different between the X direction and the Y direction may mean that a wavefront curvature of the laser light may be different between the X direction and the Y direction. In this case, a determination may be made that astigmatism is generated in the pulsed laser light 31 outputted from the laser unit 3 or in the laser light concentration optical system 22a. A result of the measurement may be used to evaluate astigmatism in the concentrated beam.

3.6 Other Modification Examples

The configurations described by way of example in the foregoing first embodiment and modification examples thereof are non-limiting, and the following example configurations may also be employed.

The $CO_2$ laser unit is given as an example of the laser unit 3. Here, the laser unit 3 may be a pulsed laser unit. For example, the pulsed laser unit may be a solid-state pulsed laser unit, non-limiting examples of which may include a YAG laser unit, a fiber laser unit, and a titanium-sapphire laser unit. The laser unit 3 may also be any other laser unit that generates harmonic.

Although the lens or the combination of lenses is given as an example of the laser light concentration optical system 22a, the laser light concentration optical system 22a may be configured by a plurality of mirrors including a concave mirror. For example, the laser light concentration optical system 22a may include a combination of an off-axis parabolic mirror and a plane mirror.

Although the Ar gas is given as an example of the inert gas 37 in one example embodiment, the inert gas 37 may be any inert gas, non-limiting examples of which may include an He gas, a Kr gas, and an $N_2$ gas. Also, gas other than the inert gas 37, including a hydrogen gas without limitation, may be sealed in the chamber 2. Further, the gas to be sealed in the chamber 2 may be a mixed gas of plural kinds of gases.

Although the diamond window is given as an example of the window 21, the window 21 may be made of any material that allows the $CO_2$ laser light to be transmitted therethrough, such as, but not limited to, ZnSe. The diamond window, however, may be preferable in an example embodiment where an output of the pulsed laser light 31 outputted from the laser unit 3 is equal to or higher than hundreds of watts.

The setting of the delay time td performed in the delay circuit 71 and the setting of the pulse width performed in the one-shot circuit 72 may alternatively be performed by the measurement controller 53. Also, although the measurement controller 53, the delay circuit 71, and the one-shot circuit 72 are described as being separate from one another, the measurement controller 53 may include the delay circuit 71 and the one-shot circuit 72.

4. EUV Light Generating Apparatus Including Concentrated Pulsed Laser Light Beam Measuring Apparatus

Second Embodiment

4.1 Configuration

Figure 15:
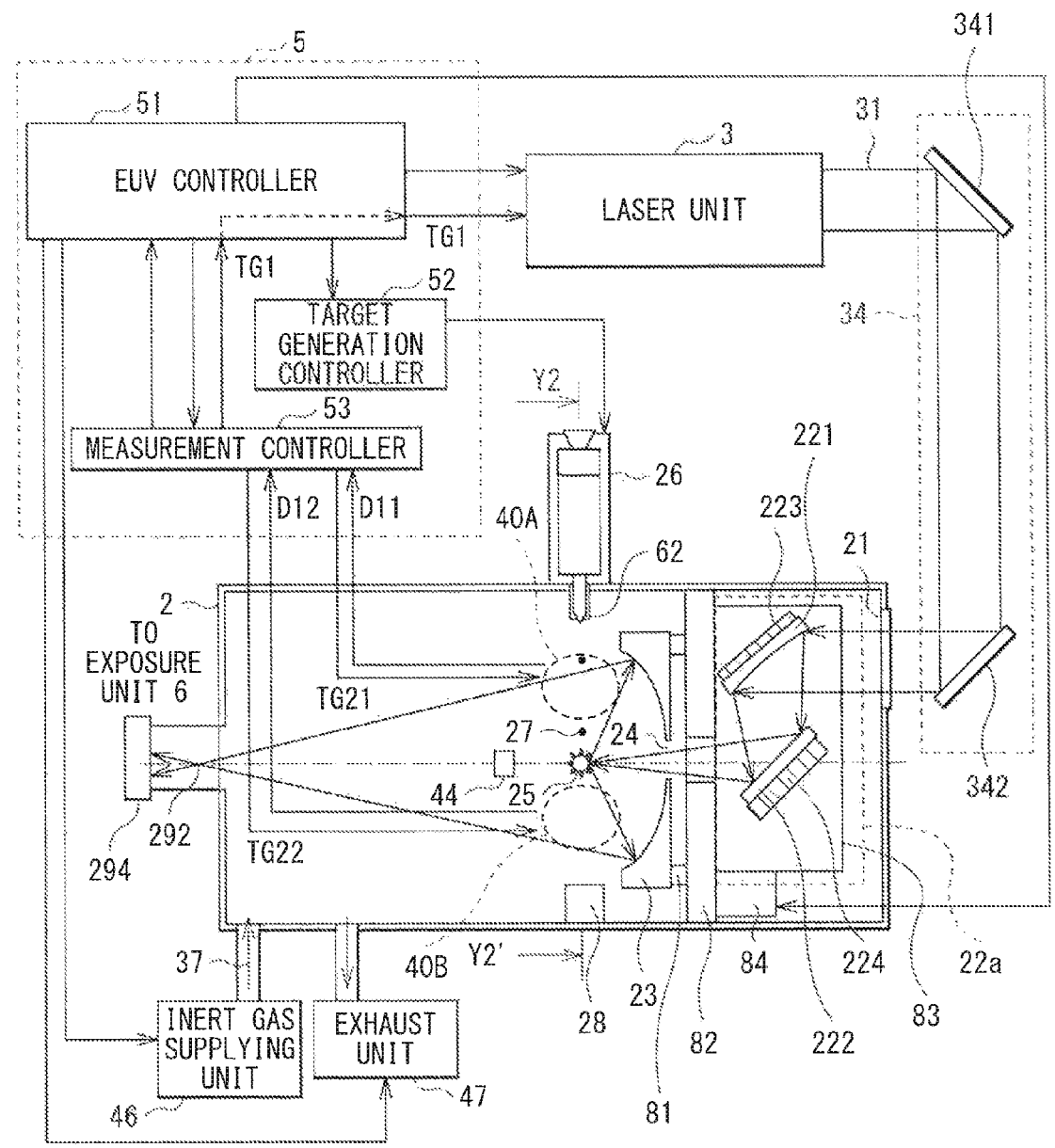
FIG. 15 schematically illustrates an example of a configuration of an EUV light generating apparatus that includes any concentrated pulsed laser light beam measuring apparatus.
Figure 16:
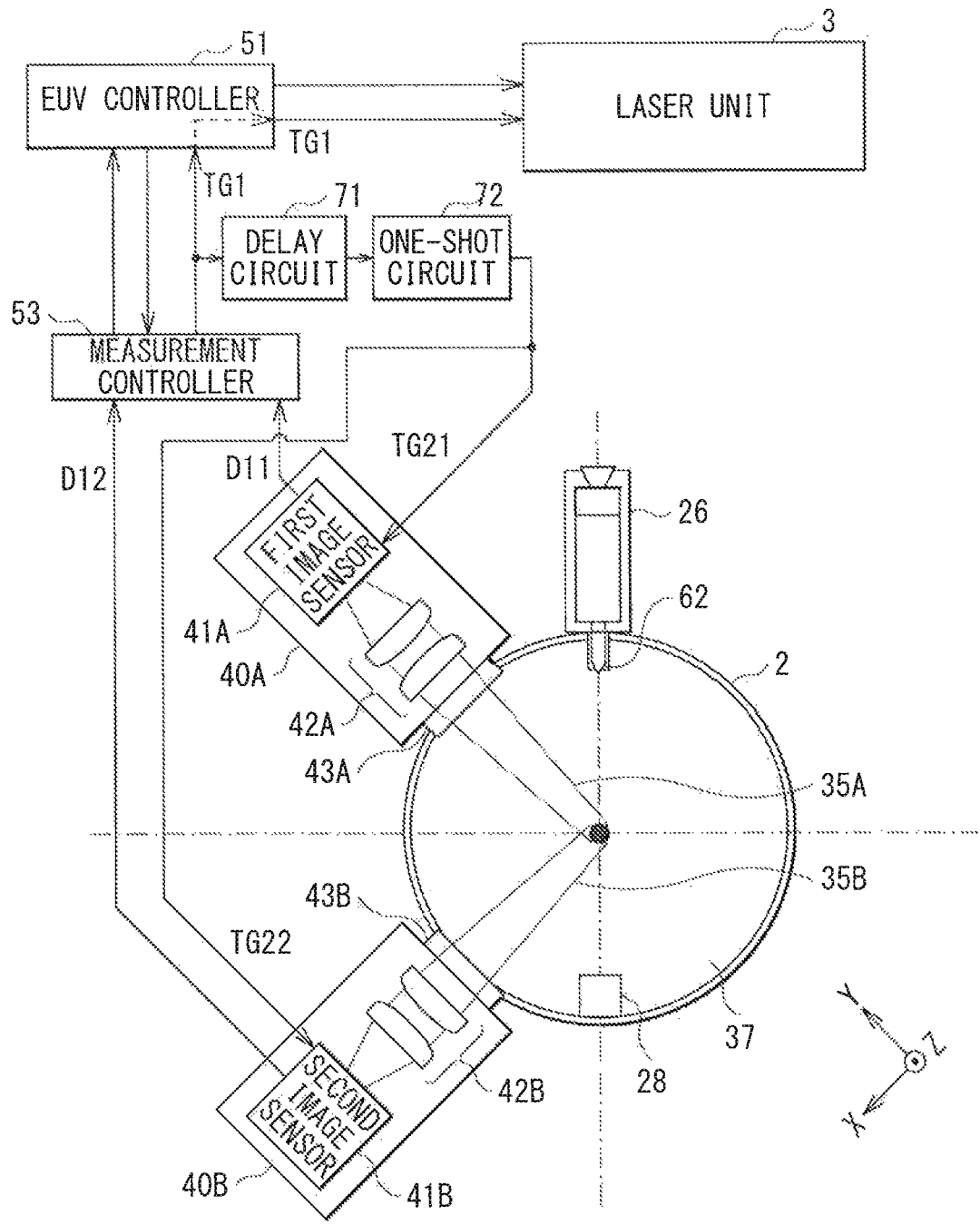
FIG. 16 schematically illustrates an example of a cross-sectional configuration, taken along line Y2-Y2' of FIG. 15, of the EUV light generating apparatus that includes the concentrated pulsed laser light beam measuring apparatus illustrated in FIG. 15.

FIGS. 15 and 16 each illustrates an example of a configuration of an EUV light generating apparatus according to a second embodiment, in which FIG. 15 illustrates a configuration in a cross-section that includes the Z axis, and FIG. 16 illustrates a cross-sectional configuration taken along line Y2-Y2' of FIG. 15. FIGS. 15 and 16 each illustrates one example embodiment in which the EUV light generating apparatus is mounted with a measuring apparatus that may be similar to the concentrated pulsed laser light beam measuring apparatus illustrated in FIGS. 12 and 13.

The EUV light generating apparatus may be used together with one or more laser units 3. The EUV light generating apparatus may include the chamber 2, the EUV light generation controller 5, the laser light traveling direction controlling section 34, an exhaust unit 47, an inert gas supplying unit 46, the delay circuit 71, and the one-shot circuit 72. The EUV light generation controller 5 may include an EUV controller 51, a target generation controller 52, and the measurement controller 53.

The laser light traveling direction controlling section 34 may be so disposed as to allow the pulsed laser light 31 outputted from the laser unit 3 to enter the chamber 2. The laser unit 3 may be a $CO_2$ laser unit that outputs the pulsed laser light 31. The pulsed laser light 31 may involve a wavelength of 10.6 μm, a pulse width in a range from 10 ns to 50 ns, a laser energy in a range from 50 mJ to 400 mJ, and a repetition frequency in a range from 50 kHz to 100 kHz.

The inert gas supplying unit 46 and the exhaust unit 47 may be coupled to the chamber 2 through respective gas pipes. The chamber 2 may include the target feeder 26, the laser light concentration optical system 22a, a plate 82, and an XYZ-axis stage 84. The chamber 2 may further include the EUV light concentrating mirror 23, a mirror holder 81, the damper 44, the window 21, the target collector 28, and a gate valve 294. The chamber 2 may be attached with the first camera 40A through the window 43A, and may also be attached with the second camera 40B through the window 43B.

The target feeder 26 may be so disposed as to allow the target 27 to be outputted from a nozzle 62 to reach the plasma generation region 25 in a form of droplets. The target collector 28 may be disposed at an extension of trajectory of the droplet target 27. The window 21 may be so fixed to an inner wall of the chamber 2 as to be sealed at the inner wall.

The laser light concentration optical system 22a may include a plate 83, a holder 223, a holder 224, an off-axis parabolic mirror 221, and a plane mirror 222. The off-axis parabolic mirror 221 may be retained to the plate 83 by the holder 223. The plane mirror 222 may be retained to the plate 83 by the holder 224. A position and an attitude of each of the off-axis parabolic mirror 221 and the plane mirror 222 may be so kept as to allow the pulsed laser light 31 reflected from the off-axis parabolic mirror 221 and the plane mirror 222 to be concentrated at the plasma generation region 25. The damper 44 may be disposed, by means of an unillustrated holder of the damper 44, in the optical path of the pulsed laser light 31 concentrated by the laser light concentration optical system 22a.

The XYZ-axis stage 84 may be so disposed as to allow the beam waist formed by the laser light concentration optical system 22a to be moved in the X axis direction, the Y axis direction, and the Z axis direction.

As with the configuration example illustrated in FIG. 13, the first camera 40A and the second camera 40B may be so disposed as to be oriented in respective directions orthogonal to each other, and each may be so disposed as to be oriented in a direction orthogonal to the optical path of the pulsed laser light 31. The first camera 40A may pick up the plasma emission image from the first direction, and may output the picked up image as the first image data D11. The second camera 40B may pick up the plasma emission image from the second direction, and may output the picked up image as the second image data D12. For example, the first direction may be the Y axis direction, and the second direction may be the X axis direction.

The plate 82 may be fixed to the wall inside the chamber 2. The EUV light concentrating mirror 23 may be a mirror with a spheroidal surface around the Z axis. The EUV light concentrating mirror 23 may be so fixed to the plate 82 through the mirror holder 81 as to allow a first focal point of the spheroidal surface to be brought into coincidence with the plasma generation region 25 substantially. A central part of the EUV light concentrating mirror 23 may be provided with a thorough hole 24 through which the pulsed laser light 31 may pass.

The EUV controller 51 may supply an output signal to each of the inert gas supplying unit 46, the exhaust unit 47, the laser unit 3, the target generation controller 52, the measurement controller 53, and the gate valve 294. The signal on the oscillation trigger TG1 derived from the measurement controller 53 may be supplied through the EUV controller 51 to the laser unit 3. The gate valve 294 may be opened or closed in response to a signal supplied from the EUV controller 51, to thereby cause the inside of the chamber 2 to be in communication with, or to be isolated from, the inside of the exposure unit 6.

The laser light traveling direction controlling section 34 may be configured by two plane mirrors 341 and 342. A reflection surface of each of the plane mirrors 341 and 342, the plane mirror 222, and the off-axis parabolic mirror 221 may be coated with a film that may cause the pulsed laser light 31 to be reflected at high reflectivity. A reflection surface of the EUV light concentrating mirror 23 may be coated with a Mo/Si multilayer film.

4.2 Operation

4.2.1 Operation Upon Generation of EUV Light

The EUV controller 51 may send a droplet generation signal through the target generation controller 52 to the target feeder 26. This may cause the target 27 in the form of droplets to be formed from the nozzle 62 of the target feeder 26. The EUV controller 51 may so output the oscillation trigger TG1 to the laser unit 3 as to allow the droplet target 27 to be irradiated with the pulsed laser light 31 at timing at which the thus-formed droplet target 27 reaches the plasma generation region 25.

When the laser unit 3 receives the oscillation trigger TG1, the laser unit 3 may output the pulsed laser light 31. The pulsed laser light 31 may be reflected from the plane mirrors 341 and 342 of the laser light traveling direction controlling section 34 at high reflectivity to enter the window 21. The pulsed laser light 31 having been transmitted through the window 21 may be concentrated at the plasma generation region 25 by the off-axis parabolic mirror 221 and the plane mirror 222. The droplet target 27 having reached the plasma generation region 25 may be irradiated with the pulsed laser light 31 to be turned into the plasma, which may result in generation of the EUV light accordingly. The EUV light may be concentrated by the EUV light concentrating mirror 23 at the intermediate focus (IF) point 292 to be outputted to the exposure unit 6.

4.2.2 Operation Upon Measurement of Concentrated Beam

Figure 17:
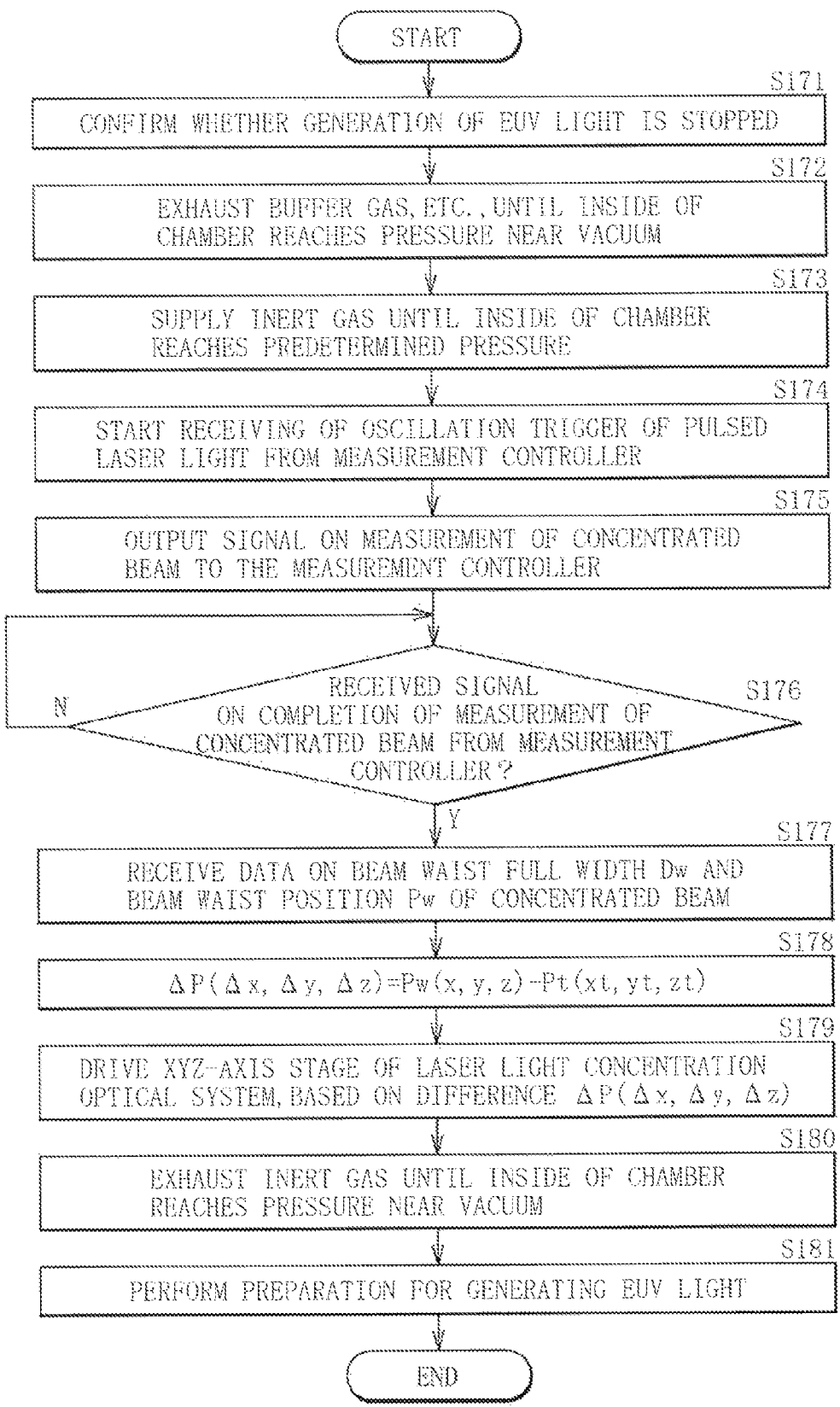
FIG. 17 is a flowchart illustrating an example of a processing operation upon measuring a concentrated beam in the EUV light generating apparatus that includes the concentrated pulsed laser light beam measuring apparatus.

FIG. 17 illustrates an example of a processing operation of the EUV controller 51 upon measuring the concentrated beam of the pulsed laser light 31. The EUV controller 51 may perform the following example operation when it is necessary to measure the concentrated beam.

The processing operation, illustrated in FIG. 17, performed by the EUV controller 51 may be executed upon, for example but not limited to, start-up of the EUV light generating apparatus and performing of maintenance thereof. Besides, the processing operation may be executed, on an as-needed basis, when it is necessary to confirm a state of concentration of the pulsed laser light 31.

The EUV controller 51 may make a confirmation as to whether an operation of generating the EUV light is stopped (step S171). To confirm whether the operation of generating the EUV light is stopped, the EUV controller 51 may make a confirmation, by means of the target generation controller 52, as to whether the generation of the droplet target 27 is stopped. Also, the EUV controller 51 may make a confirmation as to whether the outputting of the pulsed laser light 31 by the laser unit 3 is stopped. Here, the EUV controller 51 may close the gate valve 294.

Then, when there is a presence of buffer gas, etc., inside the chamber 2, the EUV controller 51 may control the exhaust unit 47 to exhaust the buffer gas, etc., until the inside of the chamber 2 reaches pressure near vacuum (step S172). The buffer gas may contain, for example but not limited to, a hydrogen gas. The wording "pressure near vacuum" may refer, without limitation, to pressure equal to or lower than 1 hPa.

Then, the EUV controller 51 may control the inert gas supplying unit 46 to supply the inert gas 37 until the inside of the chamber 2 reaches predetermined condition pressure at which the plasma is generated (step S173). The supplied inert gas 37 may be, for example but not limited to, the Ar gas.

Then, the EUV controller 51 may start receiving of the oscillation trigger TG1 (step S174). This may allow the signal on the oscillation trigger TG1 to be supplied, via the EUV controller 51, to the laser unit 3 when the signal on the oscillation trigger TG1 of the pulsed laser light 31 is outputted from the measurement controller 53 to the EUV controller 51.

Then, the EUV controller 51 may output a measurement signal to the measurement controller 53, such that the measurement process represented by the flowchart in FIG. 14 may be executed by the measurement controller 53 (step S175). This may cause the measurement controller 53 to execute the measurement process represented by the flowchart in FIG. 14. Thereafter, the measurement controller 53 may, upon completion of the measurement process, send a signal indicative of the completion of the measurement process to the EUV controller 51.

Then, the EUV controller 51 may make a determination as to whether the signal indicative of the completion of the measurement of the concentrated beam is received from the measurement controller 53 (step S176).

When the signal indicative of the completion of the measurement of the concentrated beam is received from the measurement controller 53 (step S176: Y), the EUV controller 51 may receive data on the beam waist full width Dw and a beam waist position Pw(x, y, z) from the measurement controller 53 (step S177).

Then, the EUV controller 51 may calculate a difference $\Delta P(\Delta x, \Delta y, \Delta z)$ between the beam waist position Pw(x, y, z) and desired coordinates Pt(xt, yt, zt) in the plasma generation region 25, as defined by the expression "$\Delta P(\Delta x, \Delta y, \Delta z)=Pw(x, y, z)-Pt(xt, yt, zt)$" (step S178).

Then, the EUV controller 51 may so drive the XYZ-axis stage 84 as to cause the beam waist, to be formed by the laser light concentration optical system 22a, to be located at an appropriate position, based on the difference $\Delta P(\Delta x, \Delta y, \Delta z)$ (step S179).

Then, the EUV controller 51 may control the exhaust unit 47 to exhaust the inert gas 37 such as, but not limited to, the Ar gas present inside the chamber 2, until the inside of the chamber 2 reaches the pressure near vacuum (step S180). Then, the EUV controller 51 may perform preparation for generating the EUV light (step S181). Here, the EUV controller 51 may perform, by means of the target generation controller 52, preparation for generating the droplet target 27. Also, the EUV controller 51 may perform preparation for supplying the buffer gas into the chamber 2. The EUV controller 51 may open the gate valve 294 upon completion of the preparation for generating the EUV light.

4.3 Action

In the second embodiment, the EUV light generating apparatus is mounted with the concentrated pulsed laser light beam measuring apparatus, which may make it possible to measure, with a high degree of accuracy, the beam waist full width Dw and the beam waist position Pw of the pulsed laser light 31 to be actually concentrated on the droplet target 27. It may also make it possible to so control, with a high degree of accuracy, the concentration position derived from the laser light concentration optical system 22a as to allow the beam waist position of the pulsed laser light 31 to be located at an appropriate position with respect to a desired position in the plasma generation region 25. Hence, a state of concentration of the pulsed laser light may be stabilized, which may make it possible to perform stable EUV light generation.

5. Et Cetera

5.1 Relationship Between Pressure of Inert Gas and Generation of Plasma

Figure 18:
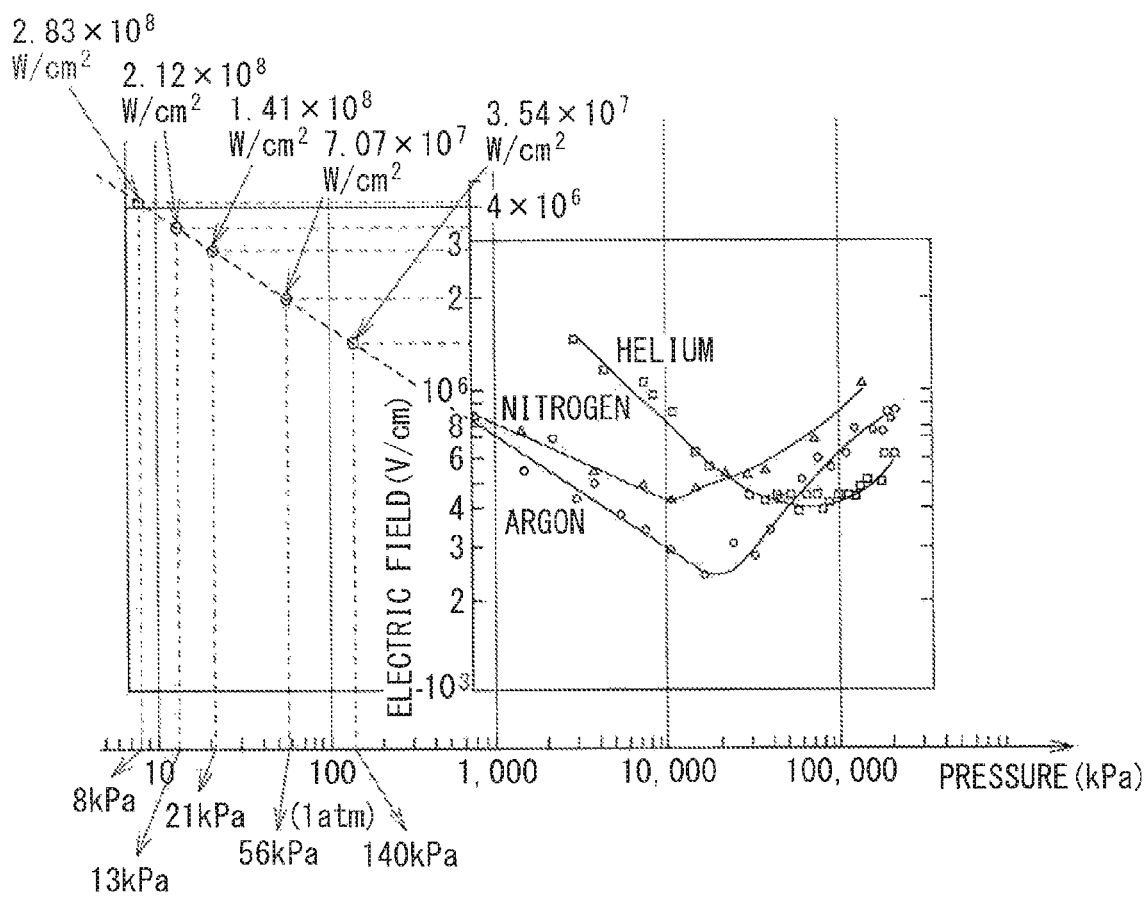
FIG. 18 illustrates an example of a relationship of pressure of each inert gas versus generation of plasma.

FIG. 18 illustrates an example of a relationship of pressure of each inert gas versus generation of the plasma. In FIG. 18, a horizontal axis denotes pressure in kPa, whereas a vertical axis denotes an electric field in V/cm. FIG. 18 illustrates an example in which argon (Ar) gas, helium (He) gas, and nitrogen ($N_2$) gas are given as examples of the inert gas. Illustrated on the left side of the vertical axis in FIG. 18 is an example, with respect to the Ar gas, of values of a light intensity In (in W/cm$^2$) of the pulsed laser light per unit area by which the plasma may be generated using the $CO_2$ laser light. The light intensity In may be represented by the following expression:

$$In=E/(\tau \cdot \pi(Dw/2)^2)$$

where Dw is the beam waist full width of the pulsed laser light, $\tau$ is a pulse width, and E is a pulse energy. For example, the beam waist full width Dw and the pulse width $\tau$ may respectively be 300 µm and 20 ns. The pulse energy E may be any of 50 mJ, 100 mJ, 200 mJ, 300 mJ, and 400 mJ, for example.

Therefore, in an example case where the foregoing pulse energy of the $CO_2$ laser light is 200 mJ, it may be determined that the generation of the plasma is possible when the pressure of the Ar gas to be supplied into the chamber 2 is 21 kPa. In this way, the pressure of the inert gas may be decided based on such a relationship illustrated by way of example in FIG. 18.

5.2 Hardware Environment of Controller

A person skilled in the art will appreciate that a general-purpose computer or a programmable controller may be combined with a program module or a software application to execute any subject matter disclosed herein. The program module, in general, may include one or more of a routine, a program, a component, a data structure, and so forth that each causes any process described in any embodiment of the disclosure to be executed.

Figure 19:
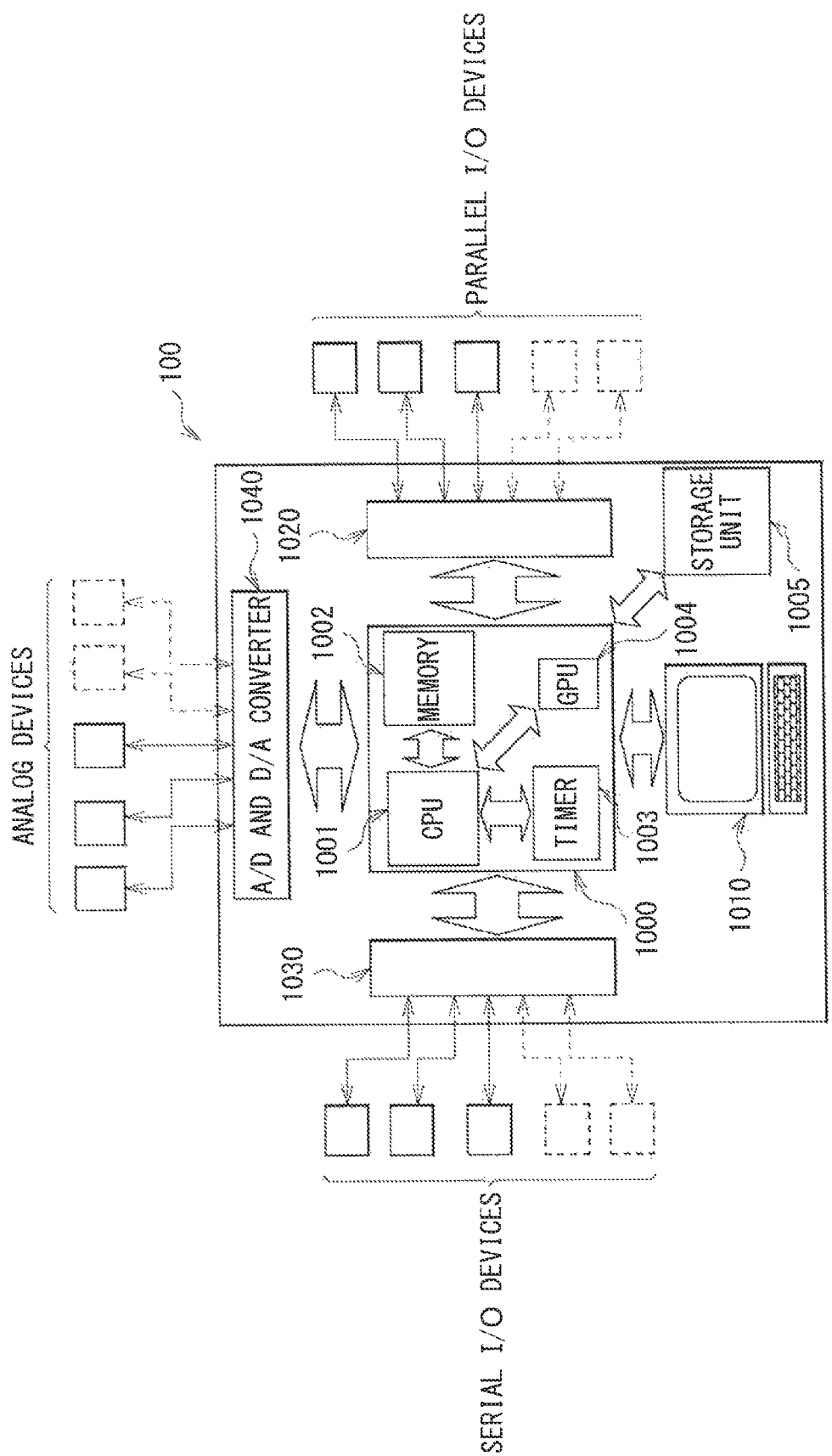
FIG. 19 illustrates an example of a hardware environment of a controller.

FIG. 19 is a block diagram illustrating an exemplary hardware environment in which various aspects of any subject matter disclosed therein may be executed. An exemplary hardware environment 100 illustrated in FIG. 19 may include a processing unit 1000, a storage unit 1005, a user interface 1010, a parallel input/output (I/O) controller 1020, a serial I/O controller 1030, and an analog-to-digital (A/D) and digital-to-analog (D/A) converter 1040. Note, however, that a configuration of the hardware environment 100 is not limited thereto.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any commercially-available processor. A dual microprocessor or any other multi-processor architecture may be used as the CPU 1001.

The components illustrated in FIG. 19 may be coupled to one another to execute any process described in any embodiment of the disclosure.

Upon operation, the processing unit 1000 may load programs stored in the storage unit 1005 to execute the loaded programs. The processing unit 1000 may read data from the storage unit 1005 together with the programs, and may write data in the storage unit 1005. The CPU 1001 may execute the programs loaded from the storage unit 1005. The memory 1002 may be a work area in which programs to be executed by the CPU 1001 and data to be used for operations of the CPU 1001 are held temporarily. The timer 1003 may measure time intervals to provide the CPU 1001 with a result of the measurement in accordance with the execution of the programs. The GPU 1004 may process image data in accordance with the programs loaded from the storage unit 1005, and may provide the CPU 1001 with a result of the processing of the image data.

The parallel I/O controller 1020 may be coupled to parallel I/O devices operable to perform communication with the processing unit 1000, and may control the communication performed between the processing unit 1000 and the parallel I/O devices. Non-limiting examples of the parallel I/O devices may include the delay circuit 71, the laser unit 3, the image sensor 41, the first image sensor 41A, and the second image sensor 41B. The serial I/O controller 1030 may be coupled to serial I/O devices operable to perform communication with the processing unit 1000, and may control the communication performed between the processing unit 1000 and the serial I/O devices. Non-limiting examples of the serial I/O devices may include the one-shot circuit 72, etc. The A/D and D/A converter 1040 may be coupled to analog devices through respective analog ports. Non-limiting examples of the analog devices may include various sensors such as, but not limited to, a temperature sensor, a pressure sensor, and a vacuum gauge sensor. The A/D and D/A converter 1040 may control communication performed between the processing unit 1000 and the analog devices, and may perform an analog-to-digital conversion and a digital-to-analog conversion of contents of the communication.

The user interface 1010 may provide an operator with display showing a progress of the execution of the programs performed by the processing unit 1000, such that the operator is able to instruct the processing unit 1000 to stop execution of the programs or to execute an interruption routine.

The exemplary hardware environment 100 may be applied to one or more of configurations of the EUV light generation controller 5, the laser light traveling direction controlling section 34, the EUV controller 51, the target generation controller 52, and the measurement controller 53 according to any embodiment of the disclosure. A person skilled in the art will appreciate that such controllers may be executed in a distributed computing environment, i.e., in an environment where tasks may be performed by processing units linked through any communication network. In any embodiment of the disclosure, the EUV light generation controller 5, the laser light traveling direction controlling section 34, the EUV controller 51, the target generation controller 52, and the measurement controller 53 may be coupled to each other through a communication network such as, but not limited to, Ethernet (Registered Trademark) or the Internet. In the distributed computing environment, the program module may be stored in each of local and remote memory storage devices.

The foregoing description is intended to be merely illustrative rather than limiting. It should therefore be appreciated that variations may be made in example embodiments of the disclosure by persons skilled in the art without departing from the scope as defined by the appended claims.

The terms used throughout the specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items. Also, the singular forms "a", "an", and "the" used in the specification and the appended claims include plural references unless expressly and unequivocally limited to one referent.

What is claimed is:

1. An extreme ultraviolet light generating apparatus, comprising:
    a chamber containing one or more kinds of gases selected from the group consisting of argon gas, helium gas, krypton gas, and $N_2$ gas;
    a light concentration optical system provided in an optical path of pulsed laser light outputted from a laser unit, and configured to concentrate the pulsed laser light into a concentrated beam;
    an image pickup section provided at a position out of the optical path of the pulsed laser light, and configured to pick up a plasma emission image that is an image of plasma emission in the chamber, the plasma emission being caused by application of the concentrated beam to the one or more kinds of gases in the chamber; and
    a measuring section configured to determine, based on the plasma emission image acquired from the image pickup section, a concentration position of the concentrated beam, and determine, as a concentration width of the concentrated beam, a minimum value of a full width of the plasma emission image acquired from the image pickup section.

2. The extreme ultraviolet light generating apparatus according to claim 1, further comprising a control section configured to delay image pickup timing of the image pickup section from timing of the output of the pulsed laser light from the laser unit.

3. The extreme ultraviolet light generating apparatus according to claim 1, wherein the image pickup section is oriented in a direction orthogonal to the optical path of the pulsed laser light.

4. The extreme ultraviolet light generating apparatus according to claim 1, wherein the image pickup section comprises a first image pickup section and a second image pickup section, the first image pickup section being oriented in a first direction, and the second image pickup section being oriented in a second direction different from the first direction.

5. The extreme ultraviolet light generating apparatus according to claim 4, further comprising a measuring section configured to determine, based on first plasma emission image acquired from the first image pickup section, a first concentration position and a first concentration width of the concentrated beam, and determine, based on second plasma emission image acquired from the second image pickup section, a second concentration position and a second concentration width of the concentrated beam.

6. The extreme ultraviolet light generating apparatus according to claim 4, wherein
the first image pickup section is oriented in a direction orthogonal to a direction in which the second image pickup section is disposed, and
the first image pickup section and the second image pickup section are oriented in the respective directions orthogonal to the optical path of the pulsed laser light.

7. The extreme ultraviolet light generating apparatus according to claim 1, further comprising a target feeder configured to feed a target substance into the chamber while the one or more kinds of gases is exhausted from the chamber, the target substance being configured to emit extreme ultraviolet light by the application of the concentrated beam.

8. The extreme ultraviolet light generating apparatus according to claim 1, wherein the chamber is filled with the one or more kinds of gases.

9. The extreme ultraviolet light generating apparatus according to claim 1, further comprising a one-shot circuit configured to output a shutter trigger signal to the image pickup section,
wherein the image pickup section includes a shutter, and open time of the shutter is defined by a pulse width of the shutter trigger signal.

10. A concentrated pulsed laser light beam measuring apparatus, comprising:
an image pickup section provided at a position out of an optical path of pulsed laser light, and configured to pick up a plasma emission image that is an image of plasma emission, the pulsed laser light being adapted to generate extreme ultraviolet light, and the plasma emission being caused by concentration of the pulsed laser light into a concentrated beam and application of the concentrated beam to one or more kinds of gases selected from the group consisting of argon gas, helium gas, krypton gas, and $N_2$ gas; and
a measuring section configured to determine, based on the plasma emission image acquired from the image pickup section, a concentration position of the concentrated beam, and determine, as a concentration width of the concentrated beam, a minimum value of a full width of the plasma emission image acquired from the image pickup section.

11. A method of generating extreme ultraviolet light, the method comprising:
supplying one or more kinds of gases into a chamber, the one or more kinds of gases being selected from the group consisting of argon gas, helium gas, krypton gas, and $N_2$ gas;
causing a laser unit to output pulsed laser light;
concentrating the pulsed laser light into a concentrated beam;
applying the concentrated beam to the one or more kinds of gases in the chamber to generate a plasma emission image that is an image of plasma emission in the chamber;
picking up the plasma emission image by an image pickup section provided at a position out of an optical path of the pulsed laser light;
determining, based on the plasma emission image acquired from the image pickup section, a concentration position of the concentrated beam by a measuring section; and
determining, as a concentration width of the concentrated beam, a minimum value of a full width of the plasma emission image acquired from the image pickup section by the measuring section.

12. A method of measuring concentrated pulsed laser light beam, the method comprising:
picking up a plasma emission image by an image pickup section provided at a position out of an optical path of pulsed laser light, the pulsed laser light being adapted to generate extreme ultraviolet light, the plasma emission image being an image of plasma emission, and the plasma emission being caused by concentrating the pulsed laser light into a concentrated beam and applying the concentrated beam to one or more kinds of gases selected from the group consisting of argon gas, helium gas, krypton gas, and $N_2$ gas;
determining, based on the plasma emission image acquired from the image pickup section, a concentration position of the concentrated beam by a measuring section; and
determining, as a concentration width of the concentrated beam, a minimum value of a full width of the plasma emission image acquired from the image pickup section by the measuring section.

* * * * *